United States Patent
Katagiri et al.

(10) Patent No.: US 7,694,245 B2
(45) Date of Patent: Apr. 6, 2010

(54) METHOD FOR DESIGNING SEMICONDUCTOR PACKAGE, SYSTEM FOR AIDING TO DESIGN SEMICONDUCTOR PACKAGE, AND COMPUTER PROGRAM PRODUCT THEREFOR

(75) Inventors: Mitsuaki Katagiri, Tokyo (JP); Satoshi Nakamura, Tokyo (JP); Takashi Suga, Tokyo (JP); Yoji Nishio, Tokyo (JP); Satoshi Isa, Tokyo (JP); Satoshi Itaya, Tokyo (JP)

(73) Assignee: Elpida Memory, Tokyo (JP)

( * ) Notice: Subject to any disclaimer, the term of this patent is extended or adjusted under 35 U.S.C. 154(b) by 198 days.

(21) Appl. No.: 11/710,965

(22) Filed: Feb. 27, 2007

(65) Prior Publication Data

US 2007/0204251 A1    Aug. 30, 2007

(30) Foreign Application Priority Data

Feb. 28, 2006  (JP) .............................. 2006-052360

(51) Int. Cl.
*G06F 17/50*    (2006.01)
(52) U.S. Cl. .............................................. 716/2; 716/1
(58) Field of Classification Search ..................... 716/1, 716/2, 18, 2.18
See application file for complete search history.

(56) References Cited

U.S. PATENT DOCUMENTS

| | | | |
|---|---|---|---|
| 6,789,241 B2 * | 9/2004 | Anderson et al. | 716/5 |
| 6,937,971 B1 * | 8/2005 | Smith et al. | 703/18 |
| 2007/0057380 A1 * | 3/2007 | Katagiri et al. | 257/778 |

FOREIGN PATENT DOCUMENTS

| | | |
|---|---|---|
| JP | 2004-54522 | 2/2004 |
| JP | 2005-196406 | 7/2005 |

* cited by examiner

*Primary Examiner*—Jack Chiang
*Assistant Examiner*—Binh C Tat
(74) *Attorney, Agent, or Firm*—Young & Thompson

(57) ABSTRACT

A method for designing a semiconductor package is disclosed, wherein the semiconductor package comprises a semiconductor chip and an adjustment target. A first target variable is calculated in consideration of a first transition state where an output level of the semiconductor chip changes from a low level to a high level. A second target variable is calculated in consideration of a second transition state where an output level of the semiconductor chip changes from the high level to the low level. Inferior one of the first and the second target variables is selected as a main target variable. The main target variable and a predetermined constraint represented in frequency domain are compared to decide design guidelines for the adjustment target.

48 Claims, 26 Drawing Sheets

US 7,694,245 B2

METHOD FOR DESIGNING SEMICONDUCTOR PACKAGE, SYSTEM FOR AIDING TO DESIGN SEMICONDUCTOR PACKAGE, AND COMPUTER PROGRAM PRODUCT THEREFOR

BACKGROUND OF THE INVENTION

This invention relates to a designing method aiming power integrity of a semiconductor chip included in a semiconductor package and to a design aid system and a computer program product in both of which the method is implemented.

In a semiconductor chip such as a dynamic random access memory (DRAM) chip, transient currents flow through a power supply pad and a ground pad of the semiconductor chip, for example, when an output driver of the semiconductor chip changes its output state, i.e. from high level to low level, or from low level to high level. The transient currents cause voltage fluctuations at the power supply pad and the ground pad.

If the above-mentioned voltage fluctuations exceed a certain level, the semiconductor chip fails to function properly. Therefore, a semiconductor package should be designed so that the above-mentioned voltage fluctuations do not exceed the voltage fluctuation limitation.

In order to verify whether voltage fluctuations are allowable, a transient analysis with a SPICE (Simulation Program with Integrated Circuit Emphasis) model is conventionally carried out as disclosed in JP-A 2004-54522. When a user finds out as a result of the conventional transient analysis that a designed semiconductor package violates the voltage fluctuation limitation therefor, the user should carry out design modification such as layout modification on the previously-designed package and then carry out a transient analysis on a newly-designed package, again. Normally, the above-mentioned analysis and design modification is carried out multiple times by trial and error, in accordance with the conventional transient analysis, so that its design cycle needs long time.

JP-A 2005-198406 has proposed another approach. The disclosed approach includes an analysis not in time domain but in frequency domain; the analysis is carried out on a fine layout to be formed on a semiconductor chip. However, the disclosed analysis cannot be carried out on a semiconductor package that comprises an already-designed semiconductor chip.

SUMMARY OF THE INVENTION

It is an object of the present invention to provide a novel design method which can shorten a design cycle of a semiconductor package even if the semiconductor package comprises an already-designed semiconductor chip.

One aspect of the present invention provides a method for designing a semiconductor package which comprises a semiconductor chip and an adjustment target. The method according to one aspect of the present invention comprises: calculating a first target variable on the basis of a first chip model and a target impedance model, the first chip model being created by representing the semiconductor chip in frequency domain in consideration of a first transition state, the first transition state being a state where an output level of the semiconductor chip changes from a low level to a high level, the target impedance model being assumed by representing the adjustment target in frequency domain; calculating a second target variable on the basis of a second chip model and the target impedance model, the second chip model being created by representing the semiconductor chip in frequency domain in consideration of a second transition state, the second transition state being a state where an output level of the semiconductor chip changes from the high level to the low level; in consideration of power integrity for the semiconductor chip, selecting inferior one of the first and the second target variables as a main target variable; and comparing the main target variable and a predetermined constraint represented in frequency domain to decide design guidelines for the adjustment target.

An appreciation of the objectives of the present invention and a more complete understanding of its structure may be had by studying the following description of the preferred embodiment and by referring to the accompanying drawings.

Figure 1:
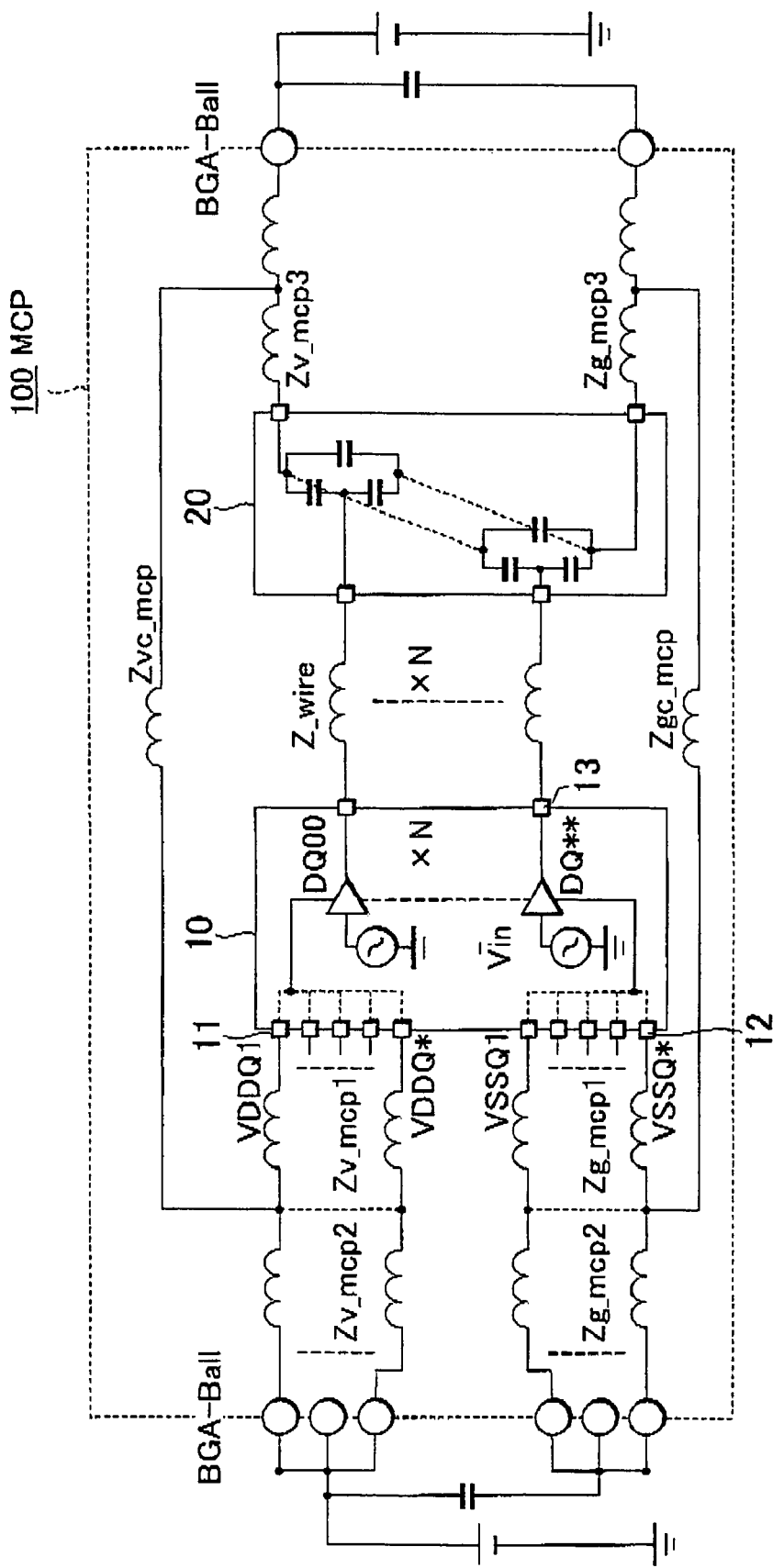
FIG. 1 is a view showing a semiconductor package which has an adjustment target on design in accordance with a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Explanation will be made about a case where a design method and analysis according to an embodiment of the present invention is applied for designing a semiconductor package shown in FIG. 1. The illustrated semiconductor package is a multi-chip package (MCP) 100 which comprises a semiconductor chip 10 and a semiconductor chip 20. In this embodiment, the semiconductor chip 10 is a DRAM chip, and the semiconductor chip 20 is a logic chip which includes a processor and so on.

The illustrated semiconductor chip 10 is provided with a plurality of power supply pads 11 and a plurality of ground pads 12; the power supply pads 11 are collectively handled as a single power supply pad 11 in the following analysis, likewise, the ground pads 12 as a single ground pad 12.

The illustrated semiconductor chip 10 further comprises a plurality of output drivers, each of which is normally constituted by a pMOS circuitry and an nMOS circuitry connected in series. The number of the output drivers in the actual DRAM chip comprises is equal to or more than the number of data lines (DQ lines). However, similar to the power supply pad 11 and the ground pad 12, the output drivers are collectively handled as a single driver, i.e. a single set of a pMOS circuitry and an nMOS circuitry, in the following analysis.

According to the method of this embodiment, the MCP 100 of FIG. 1 is represented as a combination of a model of the semiconductor chip 10 and an impedance model of circuit components such as wires and traces included in the MCP 100. Hereinafter, the model of the semiconductor chip 10 is referred to as a chip model. The circuit components such as wire and traces in the MCP 100 are collectively referred to as an adjustment target, and its impedance model is referred to as a target impedance model.

Figure 2:
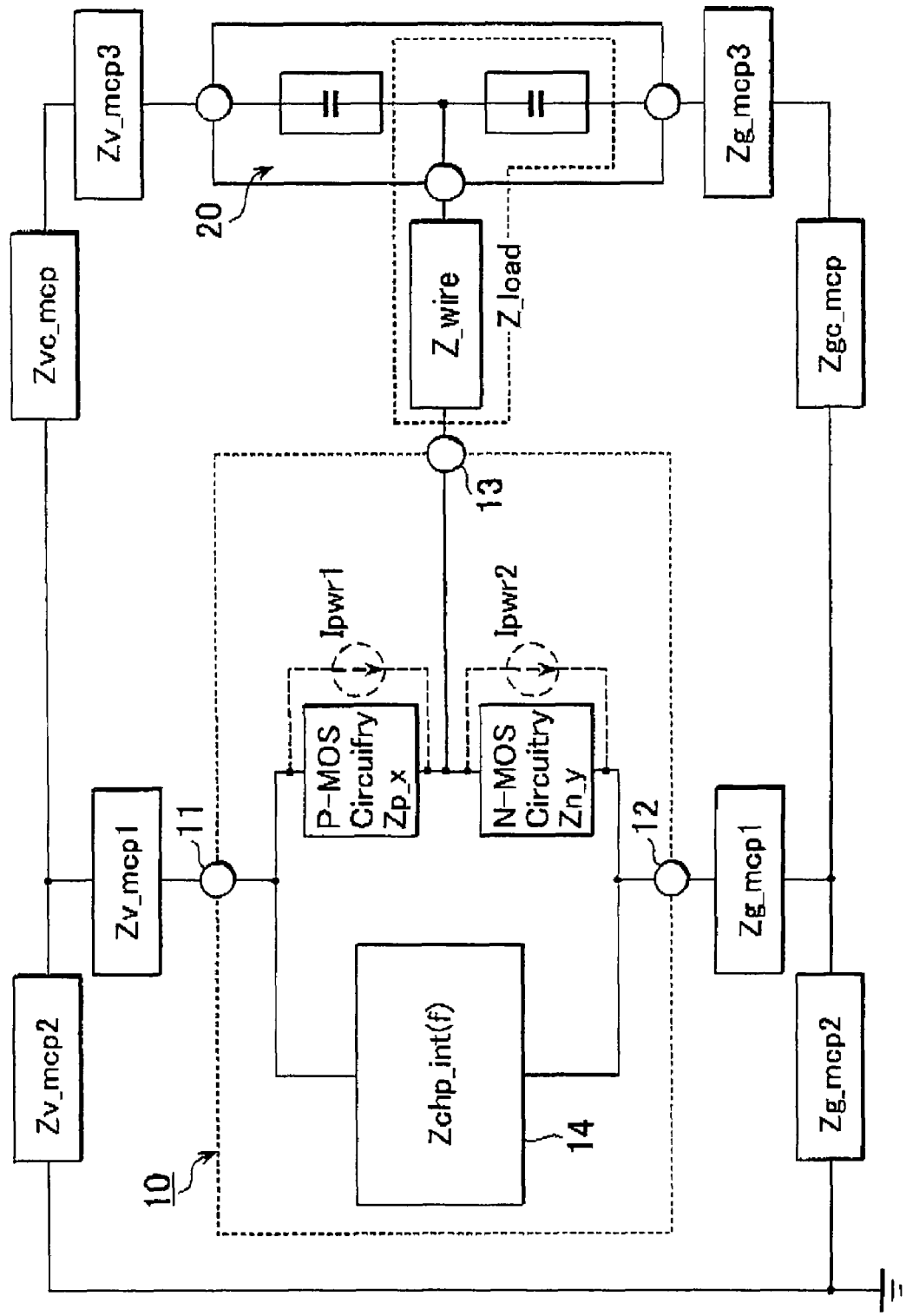
FIG. 2 is a view showing a general model of the semiconductor package of FIG. 1.

As shown in FIG. 2, the semiconductor chip 10 includes an internal section 14 which has an internal impedance Zchp_int(f). The internal impedance Zchp_int(f) is a total impedance of components of the semiconductor chip 10 other than the output driver(s) as seen between the power supply pad 11 and the ground pad 12 from the output driver(s). The illustrated symbol Zp_x shows an impedance of the pMOS circuitry of the output driver irrespective of the state of the pMOS circuitry. If the pMOS circuitry is in an ON state, its impedance is represented as Zp_on. On the other hand, if the pMOS circuitry is in an OFF state, its impedance is represented as Zp_off. Likewiser, the illustrated symbol Zn_y shows an impedance of the nMOS circuitry of the output driver irrespective of the state of the nMOS circuitry. If the nMOS circuitry is in an ON state, its impedance is represented as Zn_on. On the other hand, if the pMOS circuitry is in an OFF state, its impedance is represented as Zn_off.

In this embodiment, different four chip models are prepared for the semiconductor chip 10, with reference to FIGS. 3 to 6.

Figure 3:
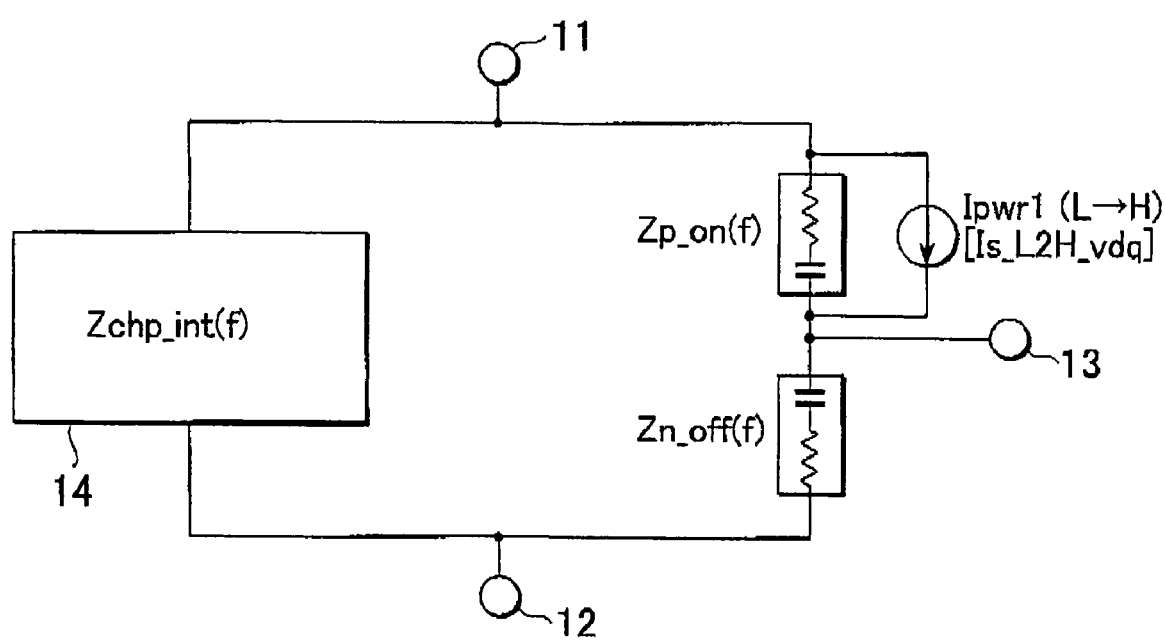
FIG. 3 is a view showing a first chip model for power supply voltage fluctuation.

FIG. 3 shows a first chip model that is created by representing the semiconductor chip 10 in frequency domain in consideration of a first transition state, wherein the first transition state is a state where an output level of the semiconductor chip changes from its low level to its high level (L->H). The illustrated first chip model is used in analysis of voltage fluctuation on the power supply pad 11 and is created by connecting a pMOS circuitry impedance Zp_on(f) and a current source Ipwr1 in parallel between the power supply pad 11 and the output pad 13, by connecting an nMOS circuitry impedance Zn_off(f) between the output pad 13 and the ground pad 12, and by connecting the internal impedance Zchip_int(f) between the power supply pad 11 and the ground pad 12. In this analysis, the pMOS circuitry impedance Zp_on(f) is an impedance of the pMOS circuitry of an ON state, while the nMOS circuitry impedance Zn_off(f) is an impedance of the nMOS circuitry of an OFF state. The current source Ipwr1 is assumed on the basis of current fluctuation on the power supply pad 11 in the first-transition state (L->H), and its current value is represented as "Is_L2H_vdq"; how to assume the current source Ipwr1 is explained in detail afterwards.

Figure 4:
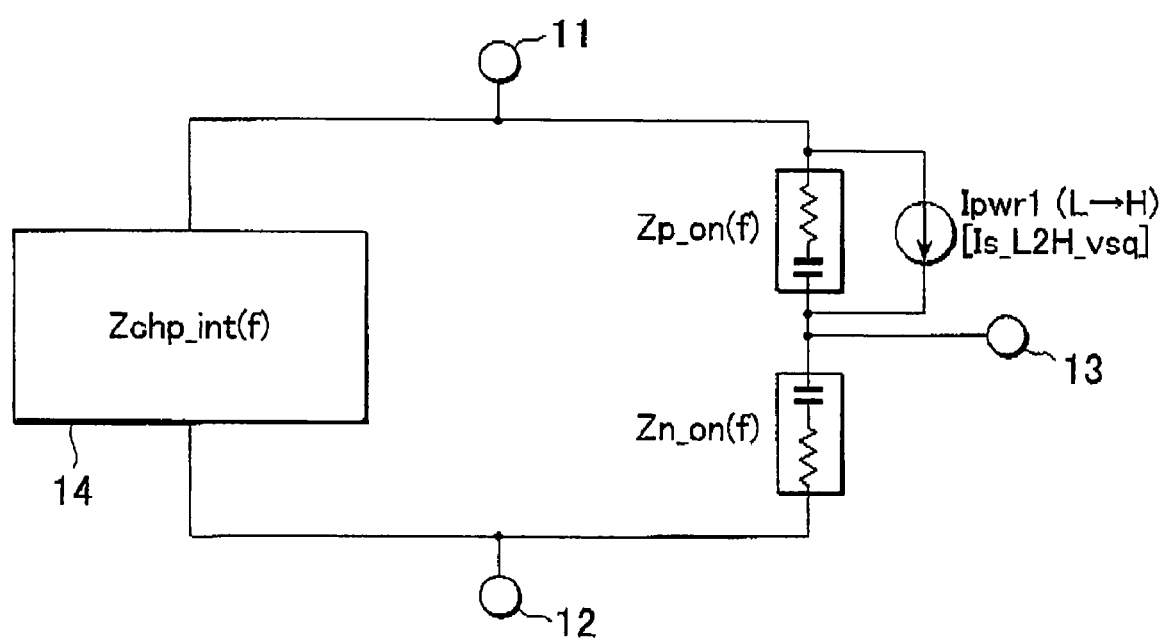
FIG. 4 is a view showing a first chip model for ground voltage fluctuation.

FIG. 4 shows another first chip model that is created by representing the semiconductor chip 10 in frequency domain in consideration of the first transition state (L->H). The illustrated first chip model is used in analysis of voltage fluctuation not on the power supply pad 11 but on the ground pad 12 and is created by connecting a pMOS circuitry impedance Zp_on(f) and a current source Ipwr1 in parallel between the power supply pad 11 and the output pad 13, by connecting an nMOS circuitry impedance Zn_on(f) between the output pad 13 and the ground pad 12, and by connecting the internal impedance Zchip_int(f) between the power supply pad 11 and the ground pad 12. In this analysis, the pMOS circuitry impedance Zp_on(f) is an impedance of the PMOS circuitry of an ON state, while the nMOS circuitry impedance Zn_on(f) is an impedance of the nMOS circuitry of an ON state. The current source Ipwr1 is assumed on the basis of current fluctuation on the ground pad 12 in the first transition state (L->H), and its current value is represented as "Is_L2H_vsq"; how to assume the current source Ipwr1 is explained in detail afterwards.

Figure 5:
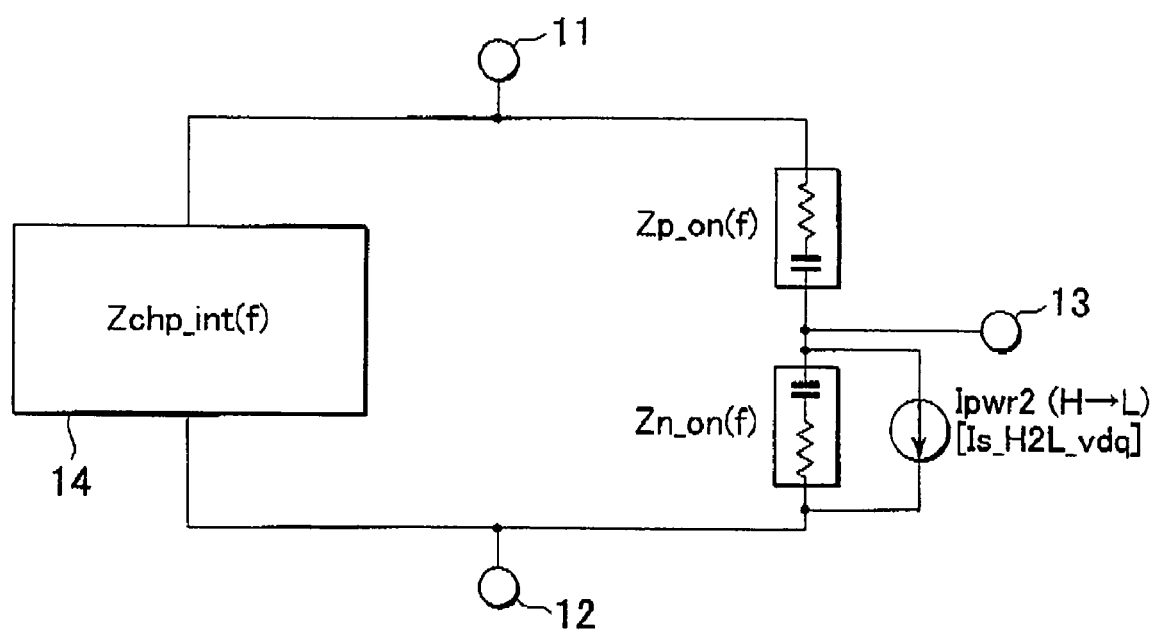
FIG. 5 is a view showing a second chip model for power supply voltage fluctuation.

FIG. 5 shows a second chip model that is created by representing the semiconductor chip 10 in frequency domain in consideration of a second transition state, wherein the second transition state is a state where an output level of the semiconductor chip changes from its high level to its low level (H->L). The illustrated second chip model is used in analysis of voltage fluctuation on the power supply pad 11 and is created by connecting a pMOS circuitry impedance Zp_on(f) between the power supply pad 11 and the output pad 13, by connecting an nMOS circuitry impedance Zn_on(f) and a current source Ipwr2 in parallel between the output pad 13 and the ground pad 12, and by connecting the internal impedance Zchip_int(f) between the power supply pad 11 and the ground pad 12. In this analysis, the pMOS circuitry impedance Zp_on(f) is an impedance of an ON state, while the nMOS circuitry impedance Zn_on(f) is an impedance of the nMOS circuitry of an ON state. The current source Ipwr2 is assumed on the basis of current fluctuation on the power supply pad 11 in the second transition state (H->L), and its current value is represented as "Is_H2L_vdq"; how to assume the current source Ipwr2 is explained in detail afterwards.

Figure 6:
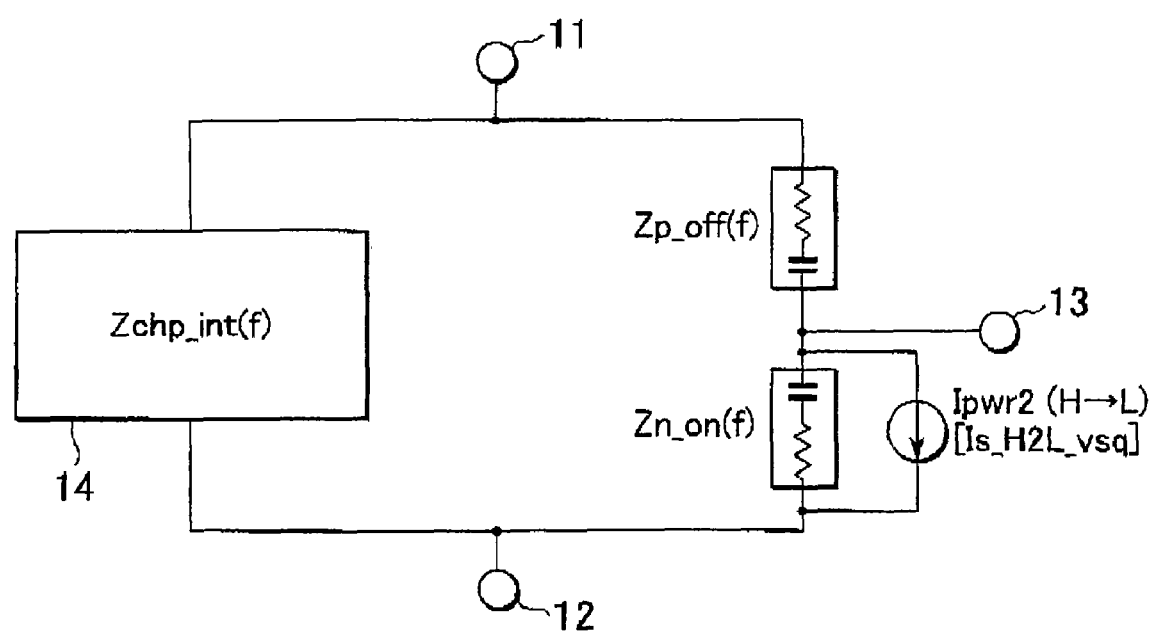
FIG. 6 is a view showing a second chip model for ground voltage fluctuation.
Figure 7:
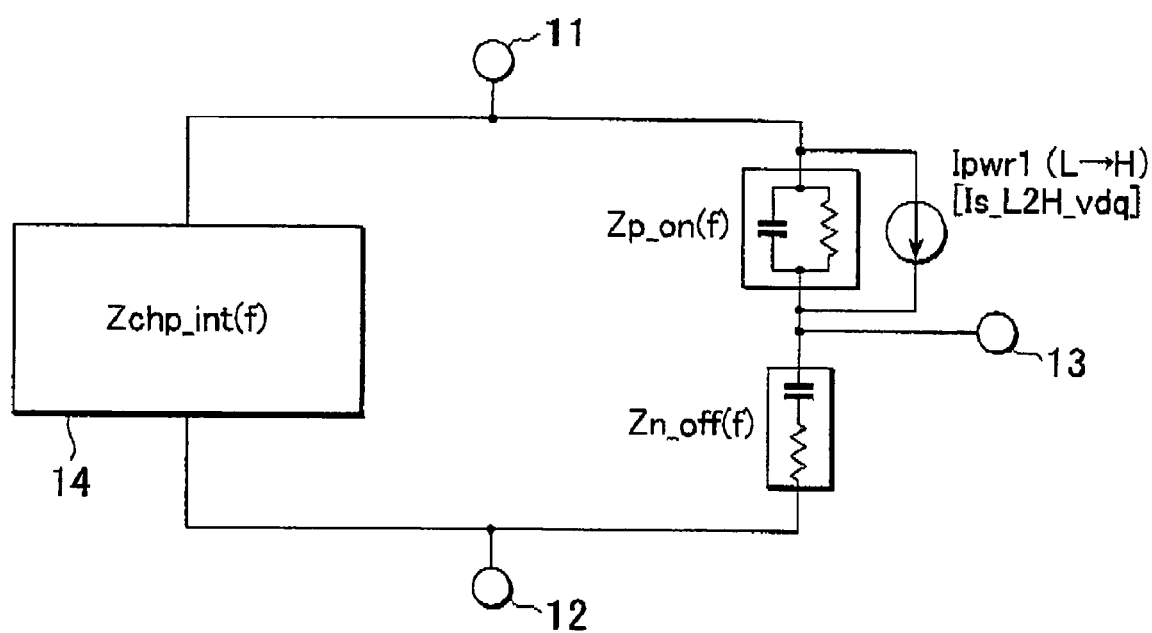
FIG. 7 is a view showing another first chip model for power supply voltage fluctuation.
Figure 8:
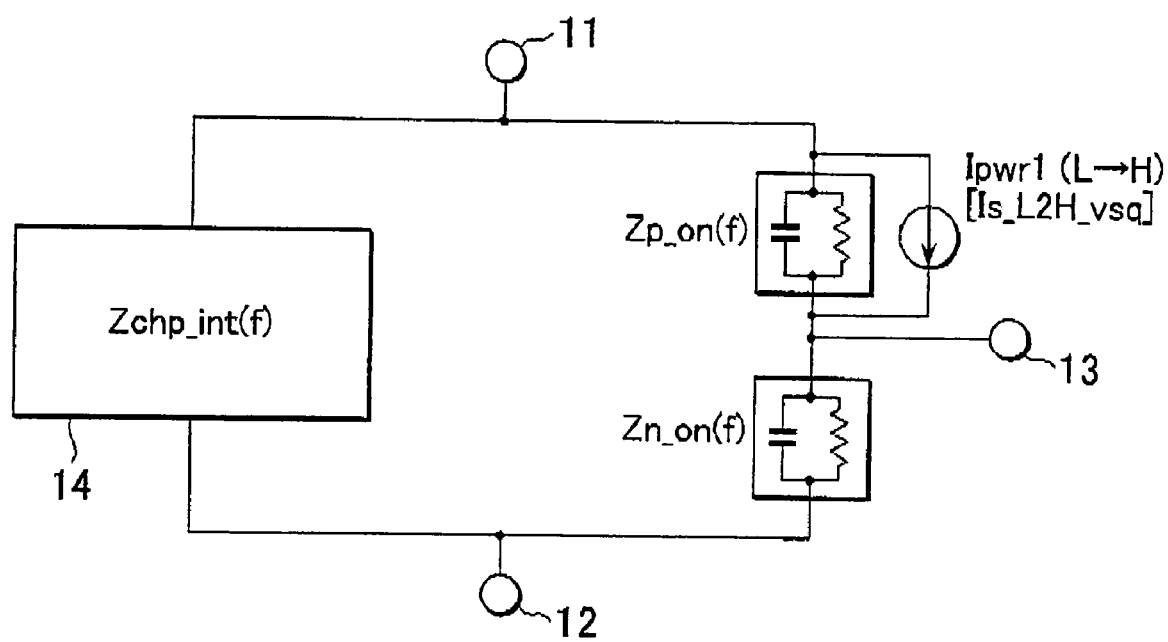
FIG. 8 is a view showing another first chip model for ground voltage fluctuation.
Figure 9:
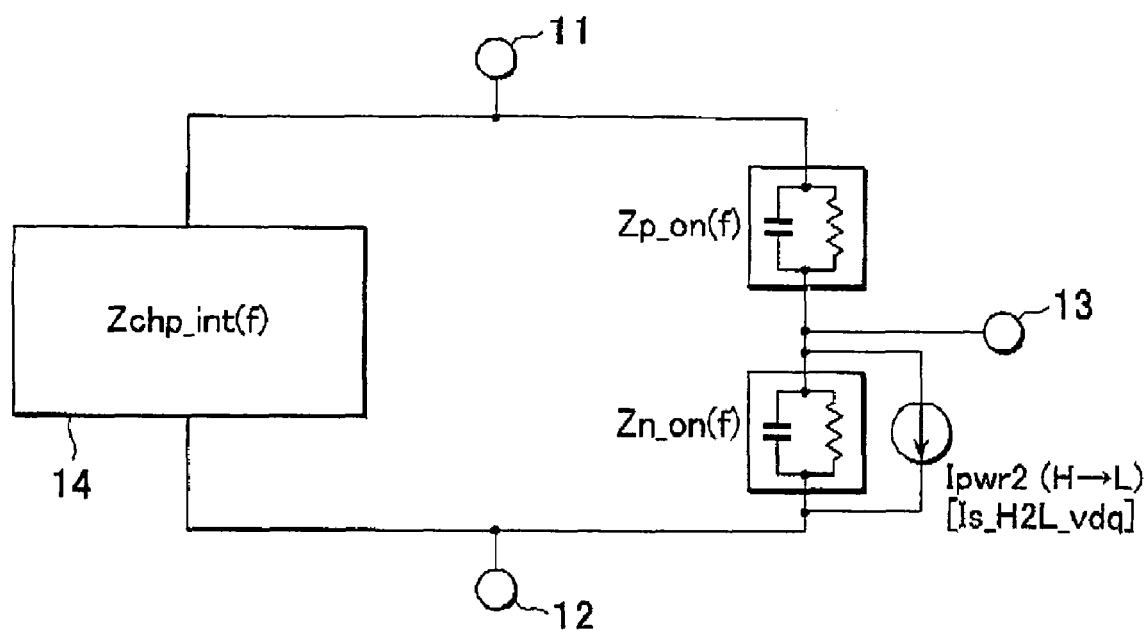
FIG. 9 is a view showing another second chip model for power supply voltage fluctuation.
Figure 10:
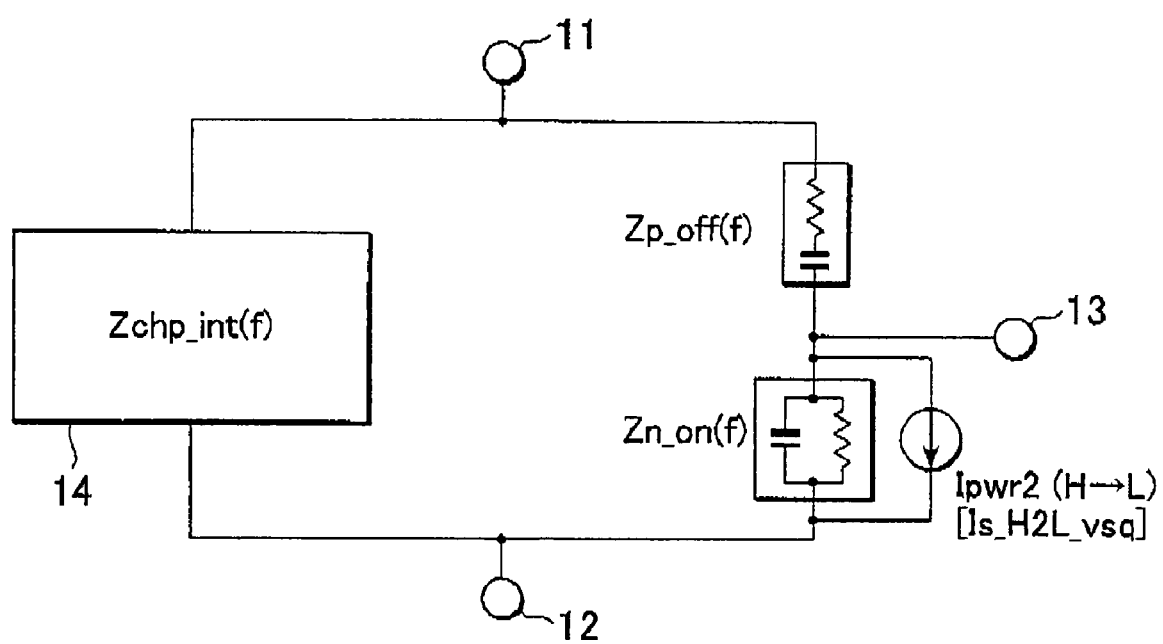
FIG. 10 is a view showing another second chip model for ground voltage fluctuation.

FIG. 6 shows another second chip model that is created by representing the semiconductor chip 10 in frequency domain in consideration of the second transition state (H->L). The illustrated second chip model is used in analysis of voltage fluctuation not on the power supply pad 11 but on the ground pad 12 and is created by connecting a pMOS circuitry impedance Zp_off(f) between the power supply pad 11 and the output pad 13, by connecting an nMOS circuitry impedance Zn_on(f) and a current source Ipwr2 in parallel between the output pad 13 and the ground pad 12, and by connecting the internal impedance Zchip_int(f) between the power supply pad 11 and the ground pad 12. In this analysis, the pMOS circuitry impedance Zp_off(f) is an impedance of the pMOS circuitry of an OFF state, while the nMOS circuitry impedance Zn_on(f) is an impedance of the nMOS circuitry of an ON state. The current source Ipwr2 is assumed on the basis of current fluctuation on the ground pad 12 in the second transition state (H->L), and its current value is represented as "Is_H2L_vsq"; how to assume the current source Ipwr2 is explained in detail afterwards.

Every equivalent circuit model shown in FIGS. 3 to 6 has a specific arrangement symmetrical with respect to the output pad 13; a capacitor and a resistor are arranged and connected in series in this order between the output pad 13 and the power supply pad 11, while a capacitor and a resistor are arranged and connected in series in this order between the output pad 13 and the ground pad 12. The symmetrical arrangement is used in consideration of actual, electrical relationship when the pMCS circuitry and the nMOS circuitry are seen from the output pad 13 toward the power supply pad 11 and the ground pad 12. However, an asymmetrical arrangement may be used; for example, a capacitor and a resistor are arranged and connected in series in this order between the output pad 13 and the power supply pad 11, while a resistor and a capacitor are arranged and connected in series in this order between the output pad 13 and the ground pad 12.

With reference to FIGS. 7 to 10, other equivalent circuit models are shown. The equivalent circuit models of FIGS. 7 to 10 relate to the already-explained equivalent models of FIGS. 3 to 6, respectively.

The equivalent circuit models of FIGS. 7 to 10 are different from the equivalent circuit models of FIGS. 3 to 6 in representation of the impedances of the pMOS circuitry and the nMOS circuitry both being in the ON state. In other words, the equivalent circuit models of FIGS. 7 to 10 use state-dependent representation of the pMOS circuitry and the nMOS circuitry. According to the state-dependent representation, the impedance of the pMOS circuitry of the ON state is calculated by using an equivalent circuit model that comprises a capacitor and a resistor connected in parallel between the power supply pad 11 and the output pad 13, while the impedance of the pMOS circuitry of the OFF state is calculated by using an equivalent circuit model that comprises a capacitor and a resistor connected in series between the power supply pad 11 and the output pad 13. In addition, the impedance of the nMOS circuitry of the OFF state is calculated by using an equivalent circuit model that comprises a capacitor and a resistor connected in series between the output pad 13 and the ground pad 12, while the impedance of the nMOS circuitry of the ON state is calculated by using an equivalent circuit model that comprises a capacitor and a resistor connected in parallel between the output pad 13 and the ground pad 12. By using the equivalent circuit models of FIGS. 7 to 10, more precise analysis results can be obtained.

Next explanation will be made about the method of the present embodiment including the way to create the above-mentioned chip models, with reference also to FIGS. 11 to 22.

Figure 11:
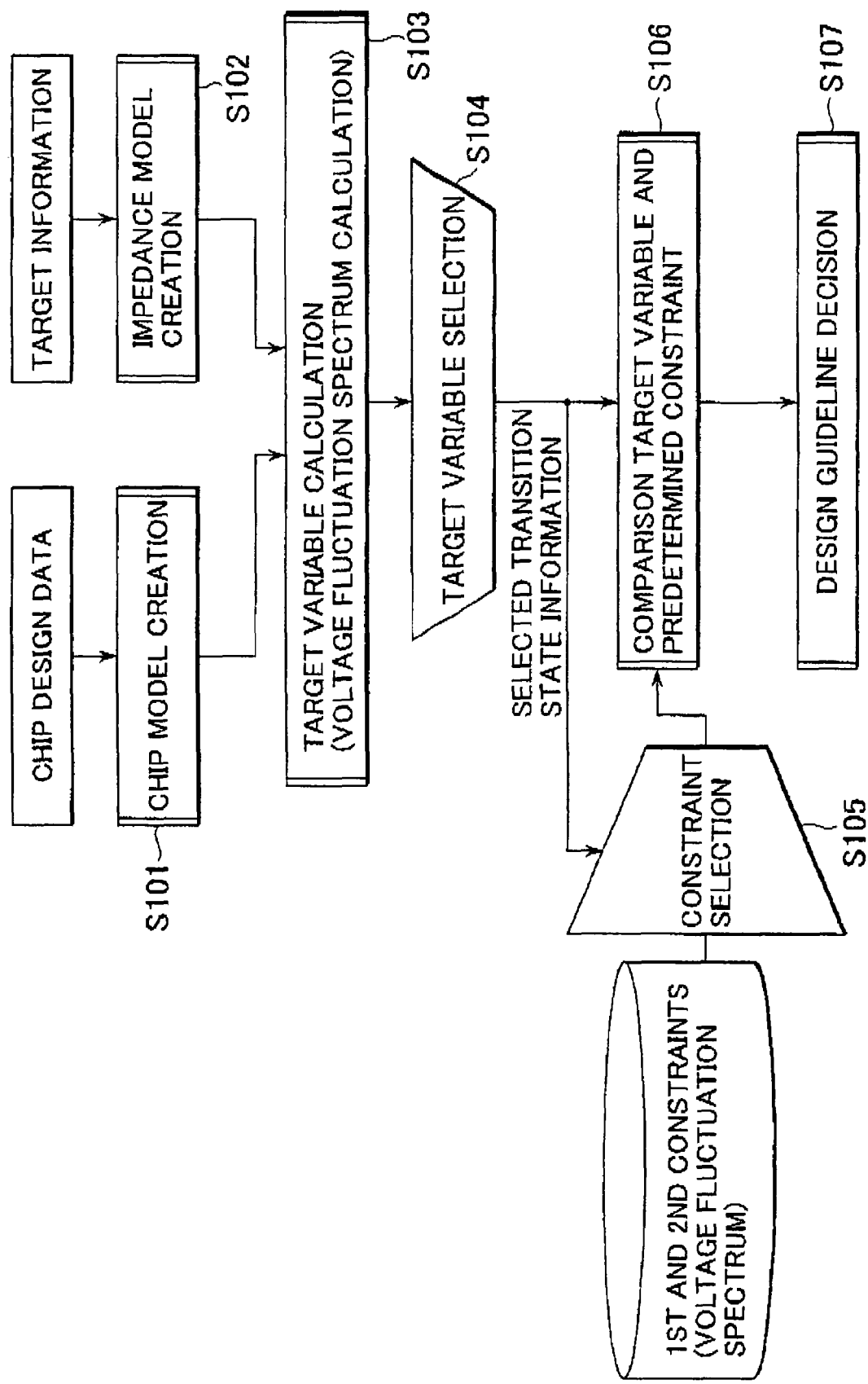
FIG. 11 is a flowchart showing a design method in accordance with the first embodiment.

As shown in FIG. 11, the first chip model and the second chip model are created on the basis of chip information such as chip design data about the semiconductor chip 10 (Step S101). The chip model creation (S101) is carried out as follows.

Figure 12:
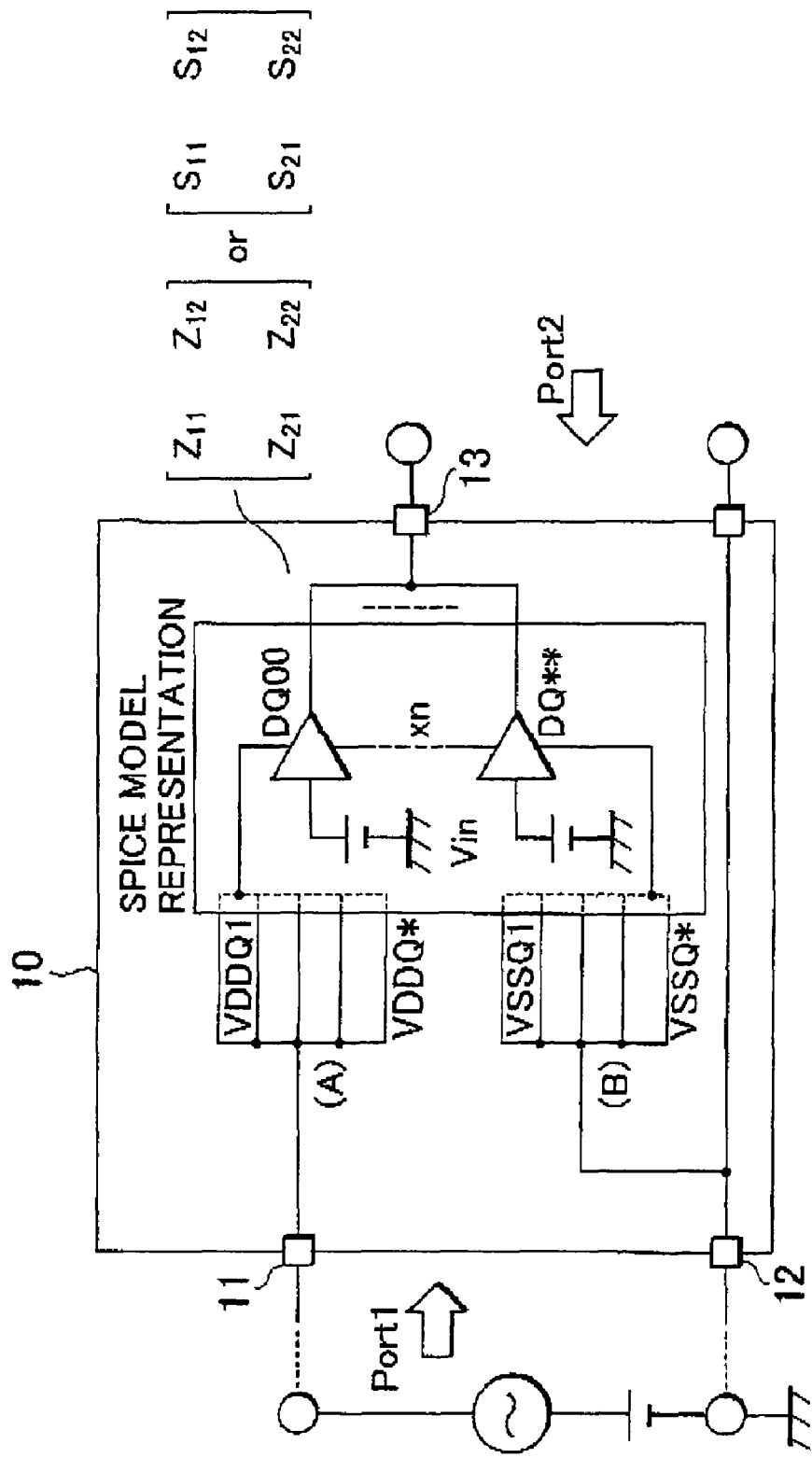
FIG. 12 is a view for use in describing how to decide impedances of the first and the second chip models.

As shown in FIG. 12, an AC analysis is carried out about a SPICE model of the semiconductor chip 10 to calculate Z parameters of the semiconductor chip 10. Although the Z parameters are directly calculated from the AC analysis in this embodiment, S parameters of the semiconductor chip 10 may be calculated at first and be then transformed into the Z parameters. In addition, the Z parameters may be obtained by actual measurements without using the above-mentioned SPICE model.

Figure 13:
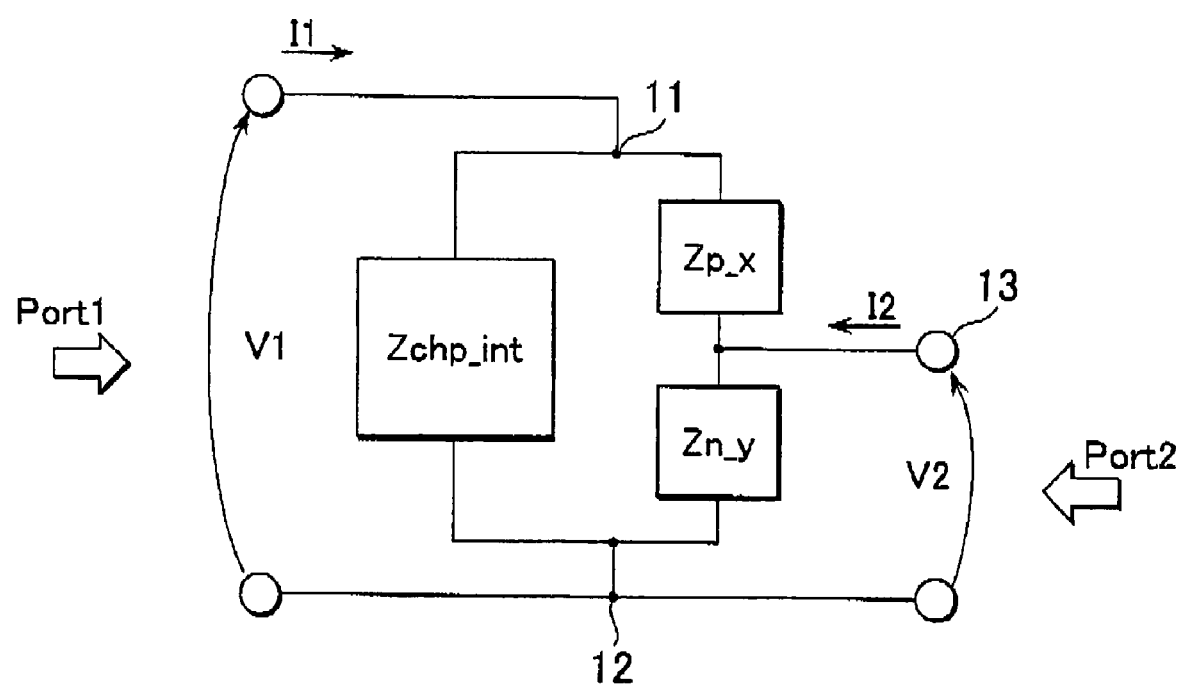
FIG. 13 is another view for use in describing how to decide impedances of the first and the second chip models.
Figure 14:
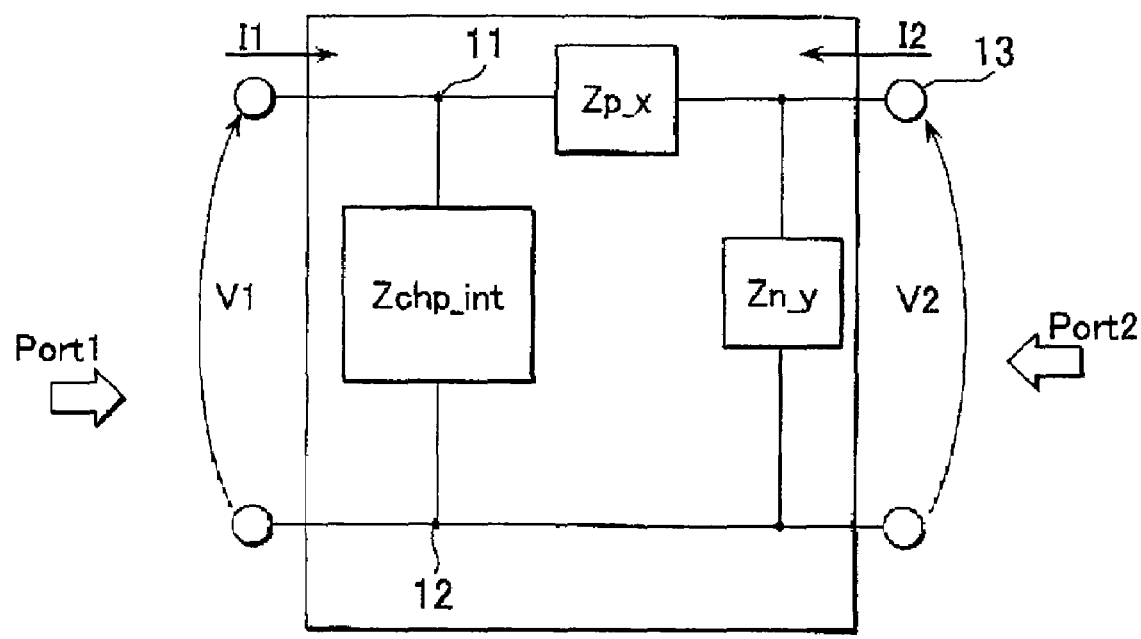
FIG. 14 is another view for use in describing how to decide impedances of the first and the second chip models.

FIG. 13 shows components of the chip model relating to impedances which constitute a two-port network. For the sake of easy understanding, the two-port network of FIG. 13 is transformed into that of FIG. 14. The Z parameters of the two-port network are represented as a following determinant:

$$\begin{bmatrix} V_1 \\ V_2 \end{bmatrix} = \begin{bmatrix} Z_{11} & Z_{12} \\ Z_{21} & Z_{22} \end{bmatrix} \begin{bmatrix} I_1 \\ I_2 \end{bmatrix} \quad (1)$$

$$= \begin{bmatrix} \dfrac{Z_{chp\_int} \times (Z_{p\_x} + Z_{n\_y})}{Z_{chp\_int} + (Z_{p\_x} + Z_{n\_y})} & \dfrac{Z_{chp\_int} \times Z_{n\_y}}{(Z_{chp\_int} + Z_{p\_x}) + Z_{n\_y}} \\ \dfrac{Z_{chp\_int} \times Z_{n\_y}}{Z_{chp\_int} + (Z_{p\_x} + Z_{n\_y})} & \dfrac{(Z_{chp\_int} + Z_{p\_x}) \times Z_{n\_y}}{(Z_{chp\_int} + Z_{p\_x}) + Z_{n\_y}} \end{bmatrix}$$

$$\begin{bmatrix} I_1 \\ I_2 \end{bmatrix}$$

Solving the above determinant (1), impedances Zp_x, Zn_y and Zchp_int are represented as following equations:

$$Z_{p\_x} = \frac{Z_{11} \cdot Z_{22}}{Z_{12}} - Z_{12} \quad (2)$$

$$Z_{n\_y} = \frac{Z_{11} \cdot Z_{22} - Z_{12}^2}{Z_{11} - Z_{12}} \quad (3)$$

$$Z_{chp\_int} = \frac{Z_{11} \cdot Z_{22} - Z_{12}^2}{Z_{22} - Z_{12}} \quad (4)$$

As apparent from the above equations (2) and (3), impedances Zp_on and Zn_off can be calculated by using impedances $Z_{11}$, $Z_{12}$ and $Z_{22}$ for the case where an output level of the output driver is high. Likewise, impedances Zp_off and Zn_on can be calculated by using impedances $Z_{11}$, $Z_{12}$ and $Z_{22}$ for the case where an output level of the output driver is low.

After the calculation of the impedances Zp_on, Zp_off, Zn_on and Zn_off, current sources Ipwr 1 and Ipwr2 are assumed as shown in FIGS. 15 to 18. Although each of the impedances Zp_on and Zn_on is represented as a combination of a capacitor and a resistor connected in parallel in FIGS. 15 to 18, the impedance Zp_on or Zn_on may be represented as only a resistor. Depending on accuracy required, serial equivalent models shown in FIGS. 3 to 6 may be used.

Figure 15:
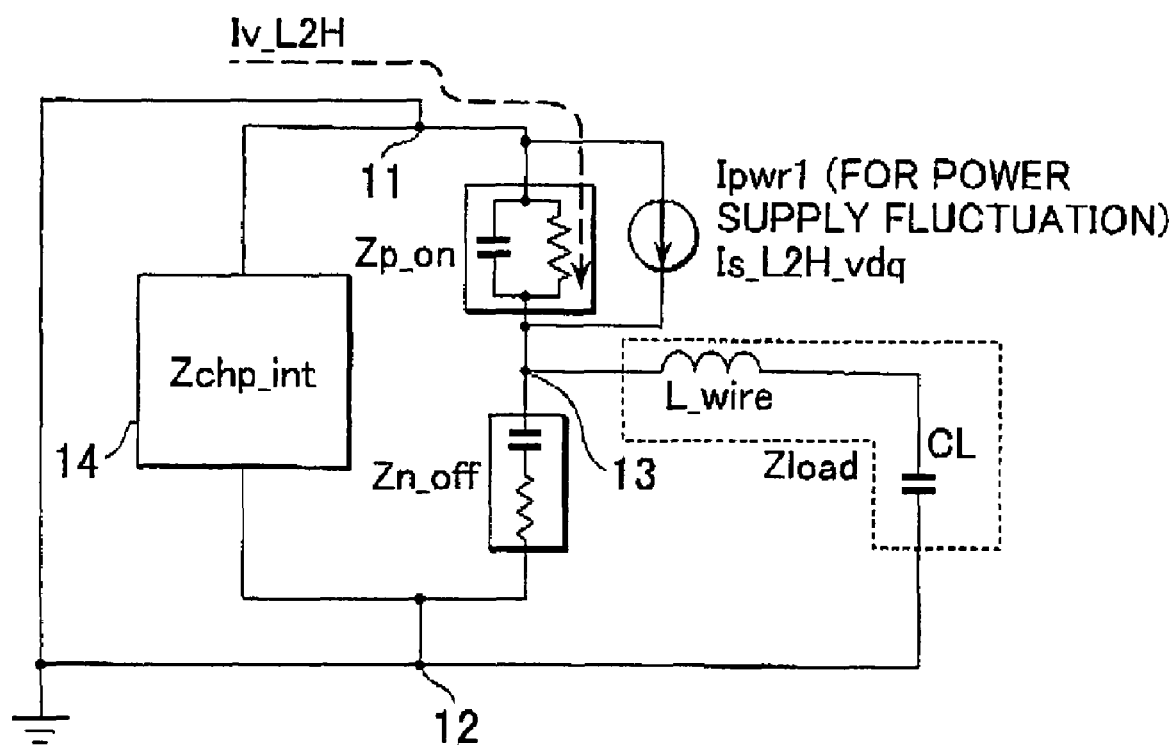
FIG. 15 is a view for use in describing how to calculate a first current source for power supply voltage fluctuation spectrum calculation.

With reference to FIG. 15, in order to calculate the current source Ipwr1 for use in analysis of power supply voltage fluctuation, a predetermined load model Zload is connected between the output pad 13 and the ground pad 12; the predetermined load model Zload may have a zero impedance. If the predetermined load model Zload is extremely smaller than the nMOS circuitry impedance Zn_off, a current Iv_L2H passing through the power supply pad 11 in the first transition state (L->H) generally flows into the pMOS circuitry impedance Zp_on and the predetermined load model Zload. In this embodiment, the current Iv_L2H is represented in frequency domain and is obtained by carrying out a transient analysis with a SPICE model of the semiconductor chip 10, followed by carrying out the Fourier transform for the result of the transient analysis. By using the current Iv_L2H, the current value Is_L2H_vdq of the current source Ipwr1 can be calculated from the following equation:

$$I_{s\_L2H\_vdq} = \frac{Z_{p\_on} + Z_{n\_off} // Z_{load}}{Z_{p\_on}} \times I_{v\_L2H} \quad (5)$$

Figure 16:
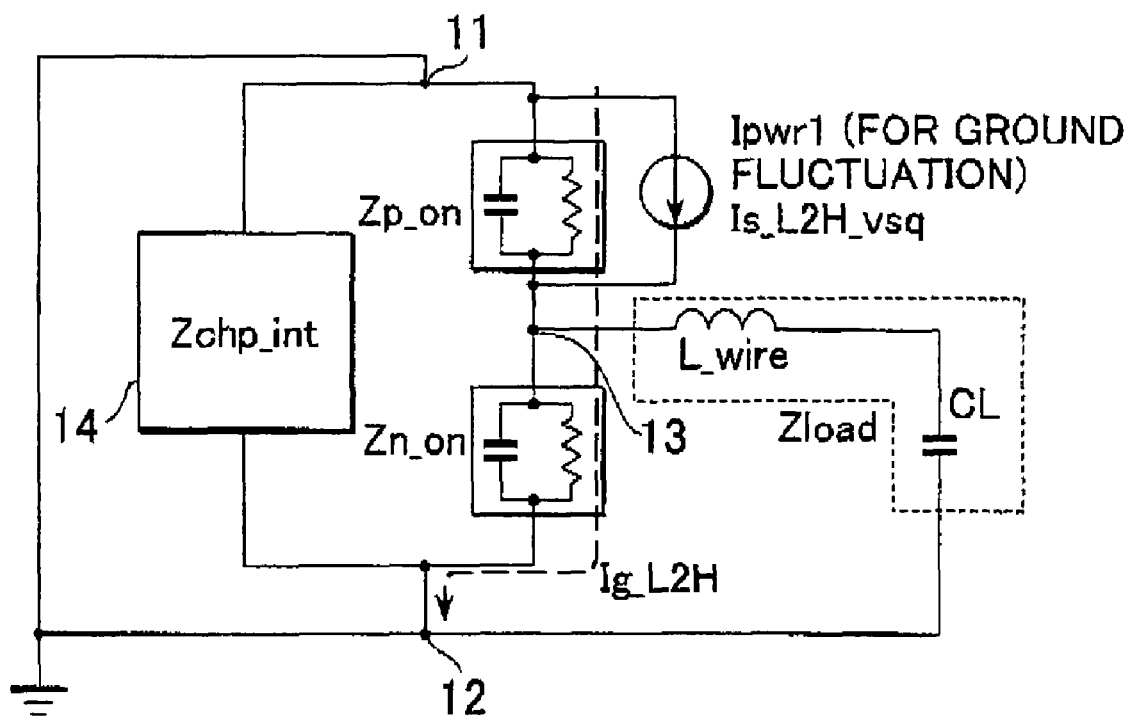
FIG. 16 is a view for use in describing how to calculate a first current source for ground voltage fluctuation spectrum calculation.

Likewise, in order to calculate the current source Ipwr1 for use in analysis of ground voltage fluctuation, the predetermined load model Zload is connected between the output pad 13 and the ground pad 12, as shown in FIG. 16. If the predetermined load model Zload is extremely larger than the nMOS circuitry impedance Zn_on, a current Ig_L2H passing through the ground pad 12 in the first transition state (L->H) generally flows into the pMOS circuitry impedance Zp_on and the nMOS circuitry impedance Zn_on. In this embodiment, the current Ig_L2H is represented in frequency domain and is obtained by carrying out a transient analysis with a SPICE model of the semiconductor chip 10, followed by carrying out the Fourier transform for the result of the transient analysis. By using the current Ig_L2H, the current value Is_L2H_vsq of the current source Ipwr1 can be calculated from the following equation:

$$I_{s\_L2H\_vsq} = \frac{Z_{p\_on} + Z_{n\_on} // Z_{Load}}{Z_{p\_on}} \cdot \frac{Z_{n\_on}}{Z_{n\_on} // Z_{load}} \times I_{g\_L2H} \quad (6)$$

Figure 17:
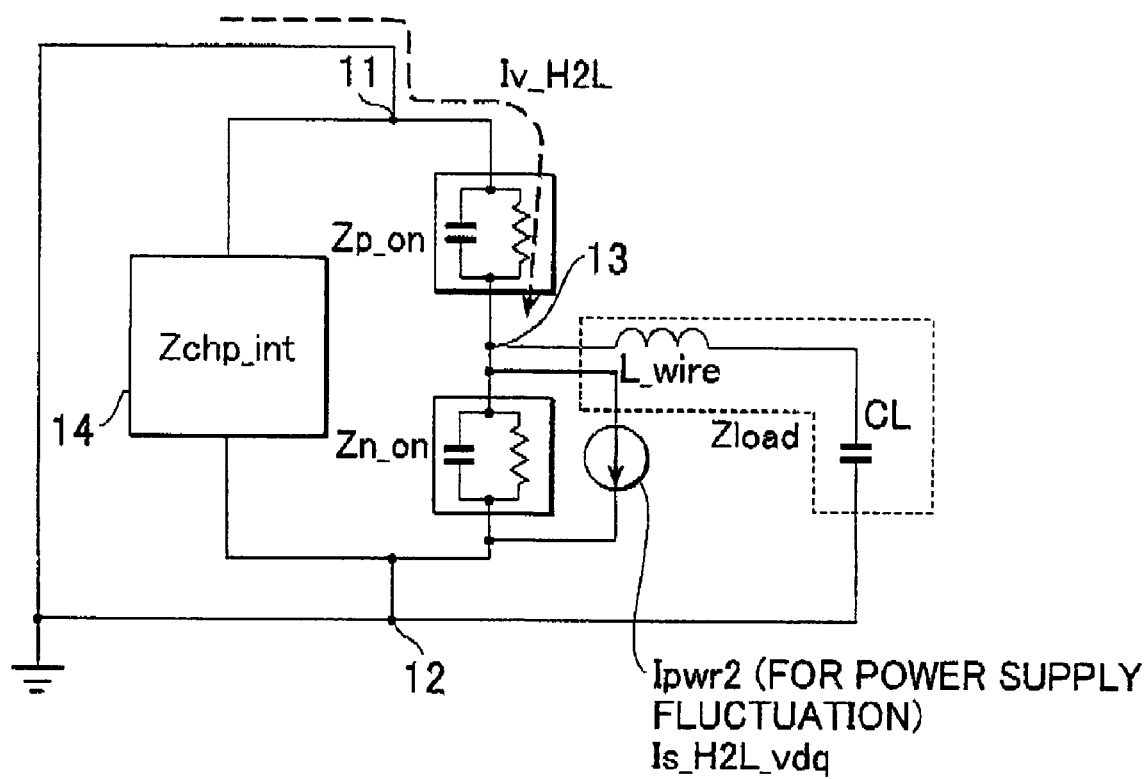
FIG. 17 is a view for use in describing how to calculate a second current source for power supply voltage fluctuation spectrum calculation.

On the other hand, in order to calculate the current source Ipwr2 for use in analysis of power supply voltage fluctuation, the predetermined load model Zload is connected between the output pad 13 and the ground pad 12, as shown in FIG. 17. If the predetermined load model Zload is extremely larger than the nMOS circuitry impedance Zn_on, a current Iv_H2L passing through the power supply pad 11 in the second transition state (H->L) generally flows into the pMOS circuitry impedance Zp_on and the nMOS circuitry impedance Zn_on. In this embodiment, the current Iv_H2L is represented in frequency domain and is obtained by carrying out a transient analysis with a SPICE model of the semiconductor chip 10, followed by carrying out the Fourier transform for the result of the transient analysis By using the current Iv_H2L, the current value Is_H2L_vdq of the current source Ipwr2 can be calculated from the following equation:

$$I_{s\_H2L\_vdq} = \frac{Z_{n\_on} + Z_{p\_on} // Z_{Load}}{Z_{n\_on}} \cdot \frac{Z_{p\_on}}{Z_{p\_on} // Z_{load}} \times I_{v\_H2L} \quad (7)$$

Figure 18:
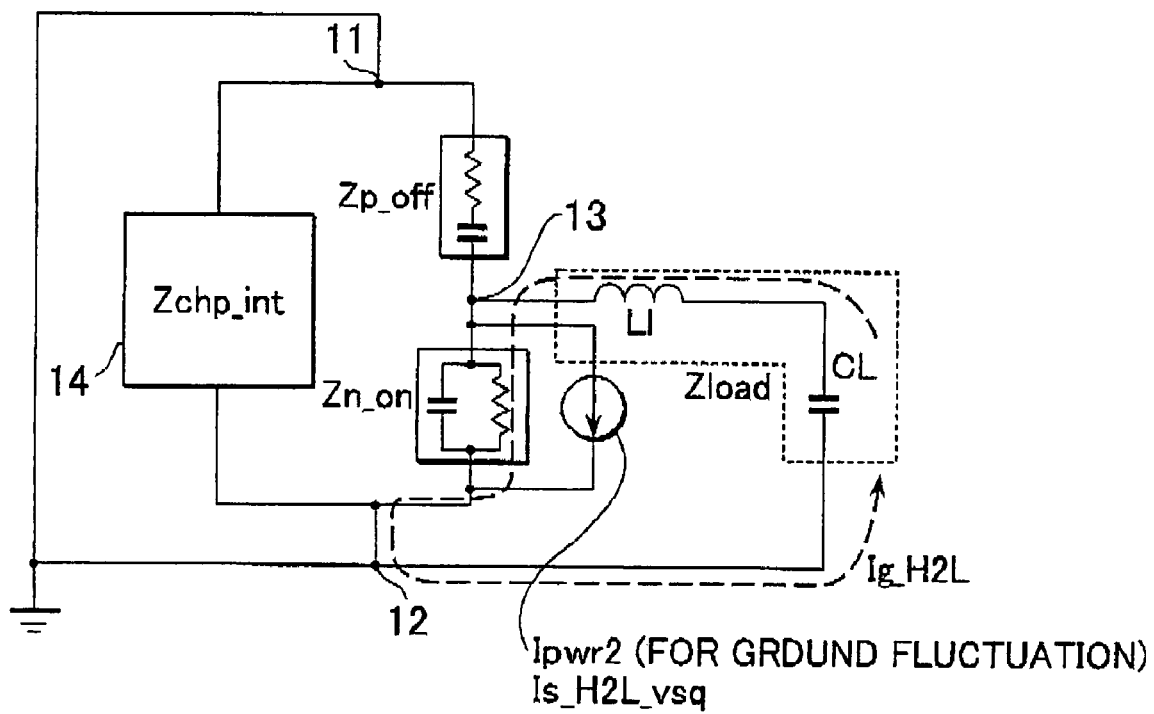
FIG. 18 is a view for use in describing how to calculate a second current source for ground voltage fluctuation spectrum calculation.

Likewise, in order to calculate the current source Ipwr2 for use in analysis of ground voltage fluctuation, the predetermined load model Zload is connected between the output pad 13 and the ground pad 12, as shown in FIG. 18. If the predetermined load model is extremely smaller than the PMOS circuitry impedance Zp_off, a current Ig_H2L passing through the ground pad in the second transition state (H->L) generally flows into the predetermined load model Zload and the nMOS circuitry impedance Zn_on. In this embodiment, the current Ig_H2L is represented in frequency domain and is obtained by carrying out a transient analysis with a SPICE model of the semiconductor chip 10, followed by carrying out the Fourier transform for the result of the transient analysis. By using the current Ig_H2L, the current value Is_H2L_vsq of the current source Ipwr2 can be calculated from the following equation:

$$I_{s\_H2L\_vsq} = \frac{Z_{n\_on} + Z_{p\_off} // Z_{Load}}{Z_{n\_on}} \times I_{g\_H2L} \quad (8)$$

Although the currents Iv_L2H, Ig_L2H, Iv_H2L and Ig_H2L are obtained by the transient analysis and the Fourier transform in this embodiment, they may be obtained by actual, direct measurements of the power supply pad 11 or the ground pad 12 of the semiconductor package 100 by the use of a spectrum analyzer or an oscilloscope.

Turning back to FIG. 11, the target impedance model is created from target information such as lengths of wires and/or traces included in the semiconductor package 100 (Step S102). Next, a first target variable is calculated from a combination of the target impedance model and the first chip model, while a second target variable is calculated from a combination of the target impedance model and the second chip model (Step S103). The calculations of the first and the second target variables are hereinbelow explained in detail.

Figure 19:
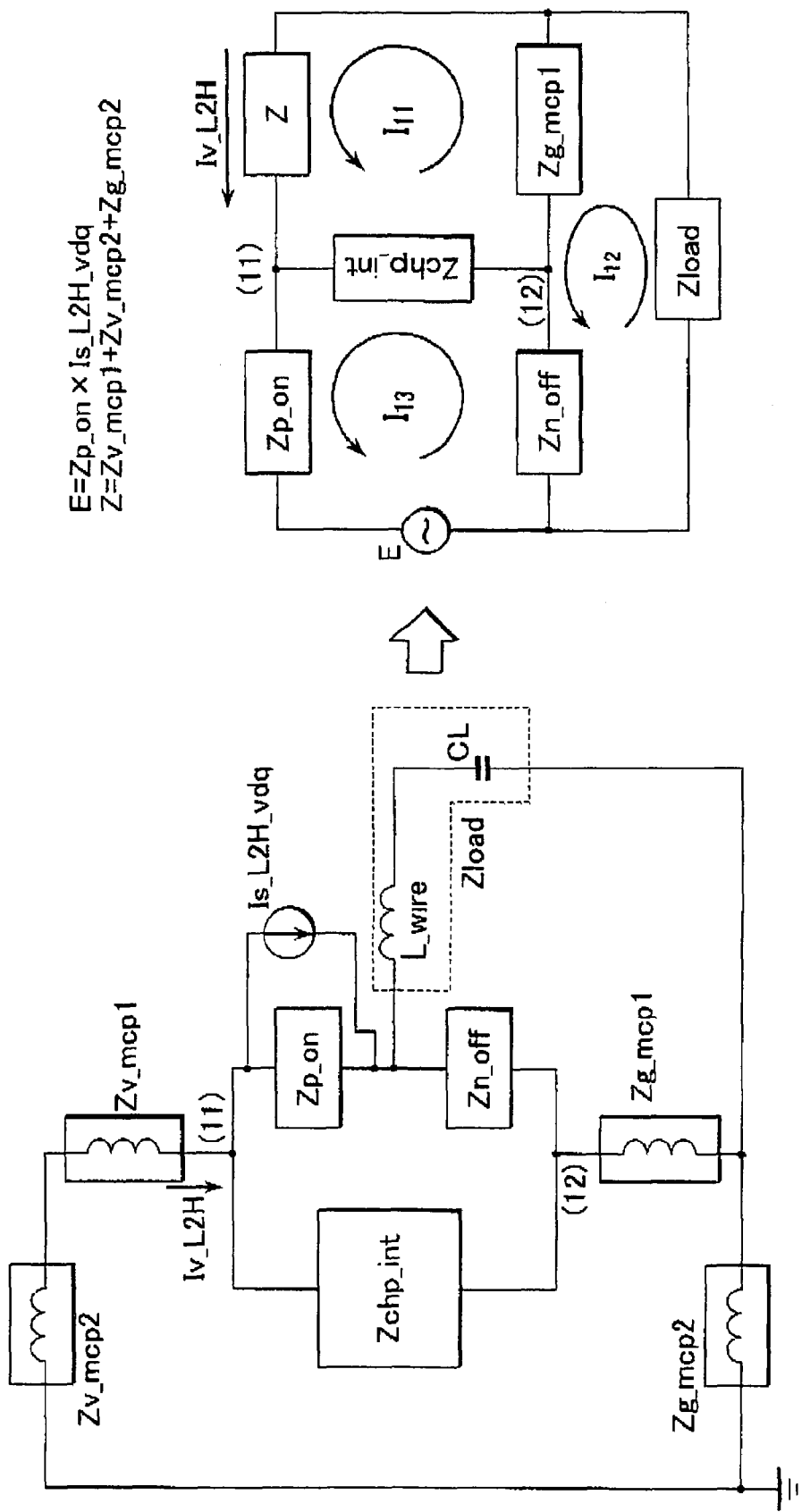
FIG. 19 is a view for use in describing how to calculate a power supply voltage fluctuation spectrum in the first transition state.

The created target impedance model as shown in FIG. 2 is connected with the first chip model for the analysis of the power supply voltage fluctuation to obtain the combination as shown in FIG. 19, wherein an impedance Zvc_mcp of FIG. 2 is set to infinity, while each of impedances Zgc_mcp, Zv_mcp3 and Zg_mcp3 is set to zero.

Next, loop equations are set up on the combination of the target impedance model and the first chip model. From the network of FIG. 19, the following three loop equations are set up:

$$\begin{bmatrix} Z_{chp\_Int} + Z + Z_{g\_mcp1} & -Z_{g\_mcp1} & -Z_{chp\_int} \\ -Z_{g\_mcp1} & Z_{g\_mcp1} + Z_{load} + Z_{n\_off} & -Z_{n\_off} \\ -Z_{chp\_int} & -Z_{n\_off} & Z_{n\_off} + Z_{p\_on} + Z_{chp\_int} \end{bmatrix} \begin{bmatrix} I_{l1} \\ I_{l2} \\ I_{l3} \end{bmatrix} = \begin{bmatrix} 0 \\ 0 \\ E \end{bmatrix} \quad (9)$$

The loop equations are solved, and the first target variable for the analysis of the power supply voltage fluctuation is obtained without carrying out a transient analysis. The obtained first target variable in this embodiment is a power supply voltage fluctuation spectrum $\Delta V_{DDQ\_L2H}$ and is represented as the following equation:

$$\Delta V_{DDQ\_L2H} = -(Z_{v1} + Z_{v2}) \times I_{l1} \qquad (10)$$

$$= -(Z_{v1} + Z_{v2}) \times$$

$$\frac{Z_{g\_mcp1} \cdot Z_{n\_off} + Z_{chp} \cdot (Z_{g\_mcp1} + Z_{load} + Z_{n\_off})}{|A|} E,$$

where $|A|$, $E$ and $Z$ are represented by the following equations, respectively:

$$|A| = \begin{bmatrix} Z_{chp} + Z + Z_{g\_mcp1} & -Z_{g\_mcp1} & -Z_{chp} \\ -Z_{g\_mcp1} & Z_{g2} + Z_{load} + Z_{n\_off} & -Z_{n\_off} \\ -Z_{chp} & -Z_{n\_off} & Z_{n\_off} + Z_{p\_on} + Z_{chp} \end{bmatrix} \qquad (11)$$

$$= Z_{g\_mcp1}(Z + Z_{load} + Z_{p\_on})(Z_{chp} + Z_{n\_off}) +$$

$$Z_{g\_mcp1} Z_{p\_on}(Z + Z_{load}) + Z_{load}(Z_{chp} + Z)(Z_{n\_off} + Z_{p\_on}) +$$

$$Z_{chp} Z(Z_{load} + Z_{n\_off}) + Z_{p\_on} Z_{n\_off}(Z_{chp} + Z)$$

$$E = Z_{p\_on} \times I_{S\_L2H\_vdq} \qquad (12)$$

$$Z = Z_{v\_mcp1} + Z_{v\_mcp2} + Z_{g\_mcp2} \qquad (13)$$

Figure 20:
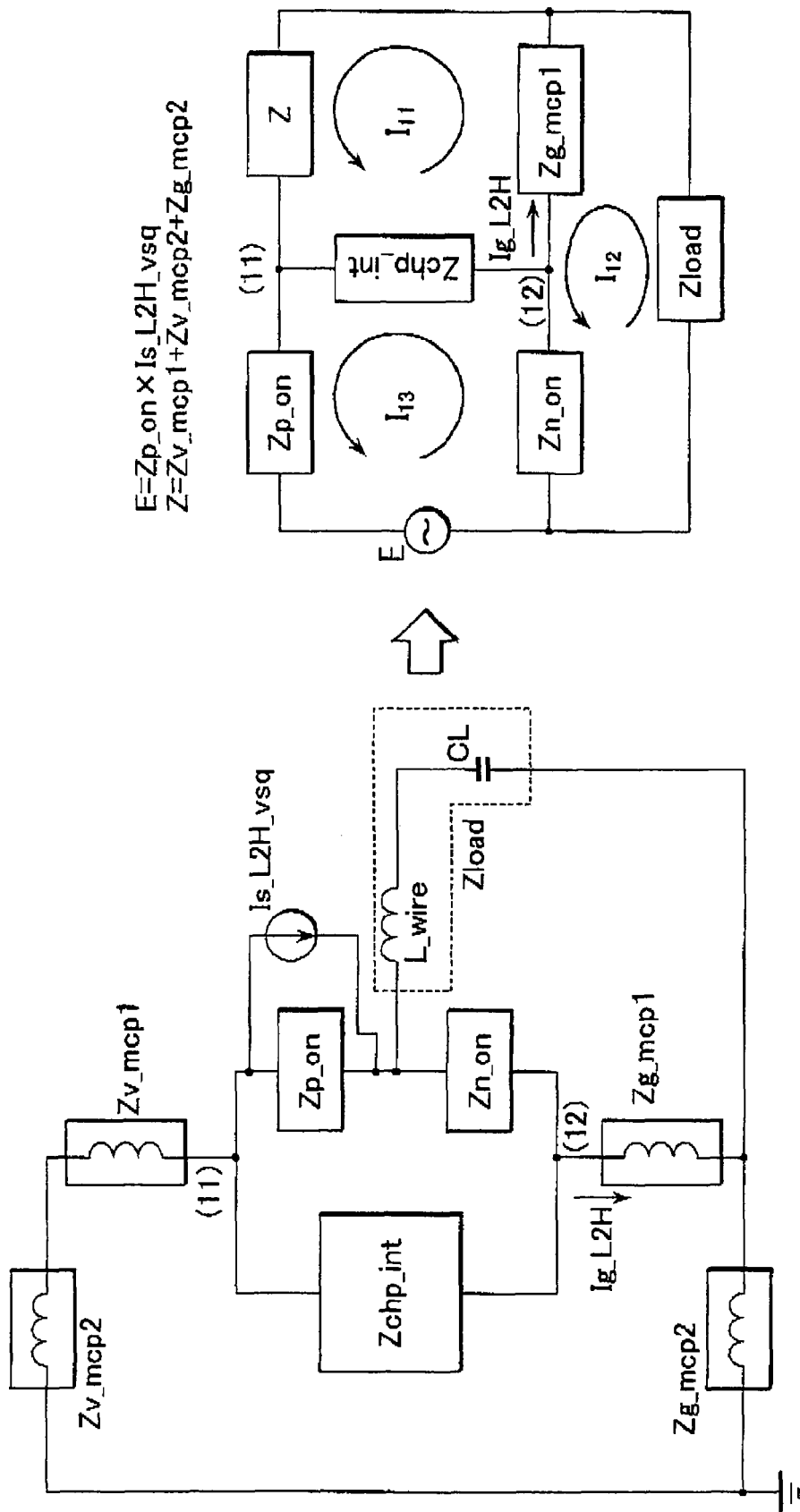
FIG. 20 is a view for use in describing how to calculate a ground voltage fluctuation spectrum in the first transition state.

Likewise, the created target impedance model as shown in FIG. 2 is connected with the first chip model for the analysis of the ground voltage fluctuation to obtain the combination as shown in FIG. 20, wherein the impedance Zvc_mcp of FIG. 2 is set to infinity, while each of the impedances Zgc_mcp, Zv_mcp3 and Zg_mcp3 is set to zero.

Next, loop equations are set up on the combination of the target impedance model and the first chip model. From the network of FIG. 20, the following three loop equations are set up:

$$\begin{bmatrix} Z_{chp\_Int} + Z + Z_{g\_mcp1} & -Z_{g\_mcp1} & -Z_{chp\_int} \\ -Z_{g\_mcp1} & Z_{g\_mcp1} + Z_{load} + Z_{n\_on} & -Z_{n\_on} \\ -Z_{chp\_int} & -Z_{n\_on} & Z_{n\_on} + Z_{p\_on} + Z_{chp\_int} \end{bmatrix} \begin{bmatrix} I_{l1} \\ I_{l2} \\ I_{l3} \end{bmatrix} = \begin{bmatrix} 0 \\ 0 \\ E \end{bmatrix} \qquad (14)$$

The loop equations are solved, and the first target variable for the analysis of the ground voltage fluctuation is obtained without carrying out a transient analysis. The obtained first target variable in this embodiment is a ground voltage fluctuation spectrum $\Delta V_{SSQ\_L2H}$ and is represented as the following equation:

$$\Delta V_{SSQ\_L2H} = Z_{g\_mcp1} \times (I_{l1} - I_{l2}) + Z_{g\_mcp2} \times I_{l1} \qquad (15)$$

$$= (Z_{g\_mcp2} + Z_{g\_mcp2}) \times$$

$$\frac{Z_{g\_mcp2} \cdot Z_{n\_on} + Z_{chp} \cdot (Z_{g\_mcp2} + Z_{load} + Z_{n\_on})}{|A|} E -$$

$$Z_{g\_mcp1} \times \frac{Z_{n\_on} \cdot (Z_{chp} + Z + Z_{g\_mcp2}) + Z_{chp} \cdot Z_{g\_mcp2}}{|A|} E,$$

where $|A|$, $E$ and $Z$ are represented by the following equations, respectively:

$$|A| = \begin{bmatrix} Z_{chp} + Z + Z_{g\_mcp1} & -Z_{g\_mcp1} & -Z_{chp} \\ -Z_{g\_mcp1} & Z_{g\_mcp1} + Z_{load} + Z_{n\_on} & -Z_{n\_on} \\ -Z_{chp} & -Z_{n\_on} & Z_{n\_on} + Z_{p\_on} + Z_{chp} \end{bmatrix} \qquad (16)$$

$$= Z_{g\_mcp1}(Z + Z_{load} + Z_{p\_on})(Z_{chp} + Z_{n\_on}) +$$

$$Z_{g\_mcp1} Z_{p\_on}(Z + Z_{load}) + Z_{load}(Z_{chp} + Z)(Z_{n\_on} +$$

$$Z_{p\_on}) + Z_{chp} Z(Z_{load} + Z_{n\_on}) + Z_{p\_on} Z_{n\_on}(Z_{chp} + Z)$$

$$E = Z_{p\_on} \times I_{S\_L2H\_csq} \qquad (17)$$

$$Z = Z_{v\_mcp1} + Z_{v\_mcp2} + Z_{g\_mcp2} \qquad (18)$$

Figure 21:
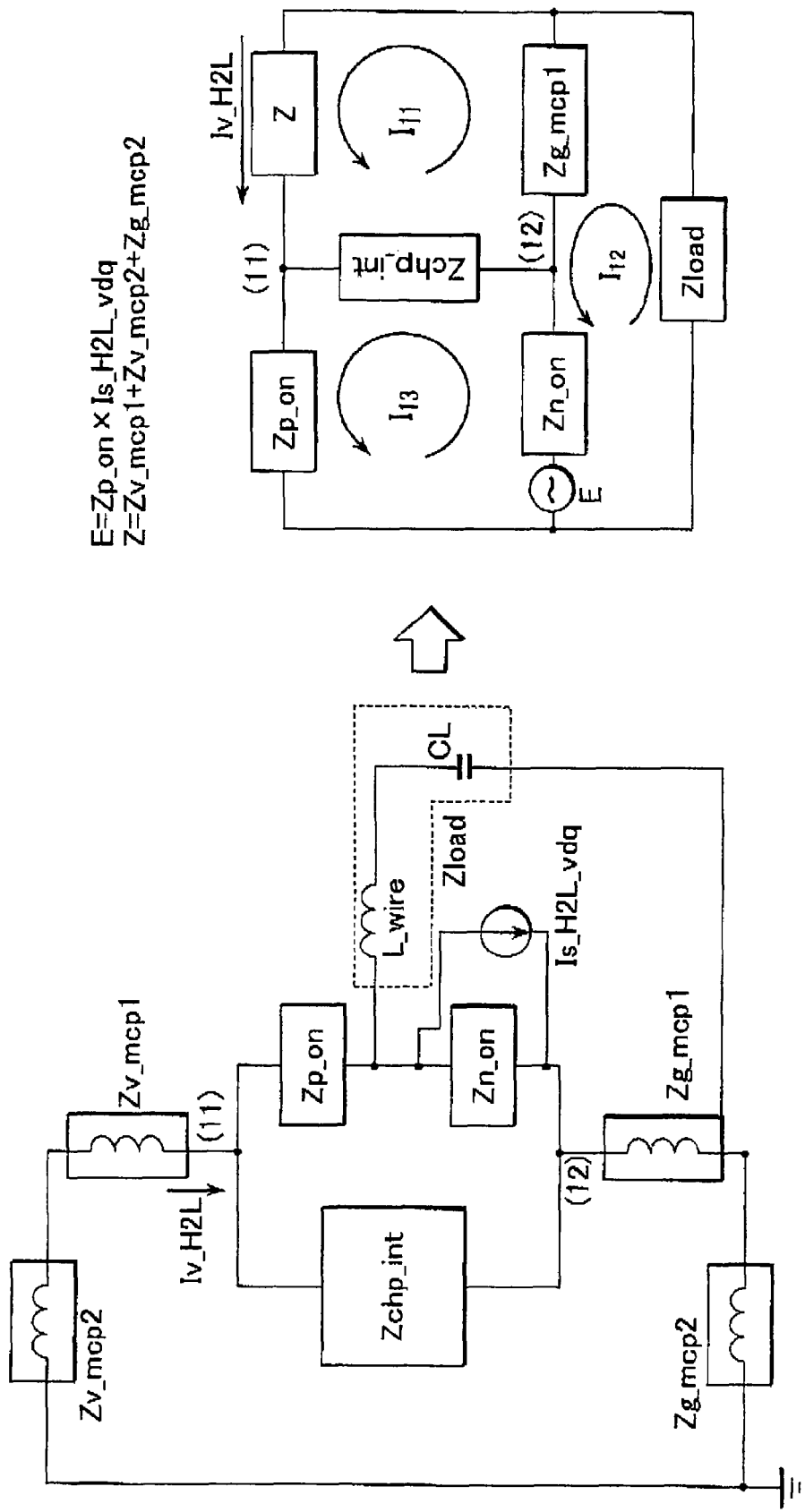
FIG. 21 is a view for use in describing how to calculate a power supply voltage fluctuation spectrum in the second transition state.

On the other hand, the created target impedance model as shown in FIG. 2 is connected with the second chip model for the analysis of the power supply voltage fluctuation to obtain the combination as shown in FIG. 21, wherein the impedance Zvc_mcp of FIG. 2 is set to infinity, while each of the impedances Zgc_mcp, Zv_mcp3 and Zg_mcp3 is set to zero.

Next, loop equations are set up on the combination of the target impedance model and the second chip model. From the network of FIG. 21, the following three loop equations are set up:

$$\begin{bmatrix} Z_{chp} + Z + Z_{g\_mcp1} & -Z_{g\_mcp1} & -Z_{chp} \\ -Z_{g\_mcp1} & Z_{g2} + Z_{load} + Z_{n\_on} & -Z_{n\_on} \\ -Z_{chp} & -Z_{n\_on} & Z_{n\_on} + Z_{p\_on} + Z_{chp} \end{bmatrix} \qquad (19)$$

$$\begin{bmatrix} I_{l1} \\ I_{l2} \\ I_{l3} \end{bmatrix} = \begin{bmatrix} 0 \\ -E \\ E \end{bmatrix}$$

The loop equations are solved, and the second target variable for the analysis of the power supply voltage fluctuation is obtained without carrying out a transient analysis. The obtained second target variable in this embodiment is a power supply voltage fluctuation spectrum $\Delta V_{DDQ\_H2L}$ and is represented as the following equation:

$$\Delta V_{DDQ\_H2L} = -(Z_{v\_mcp2} + Z_{v\_mcp1}) \times I_{l1} \qquad (20)$$

$$= -(Z_{v\_mcp2} + Z_{v\_mcp1}) \times$$

$$\frac{Z_{chp} \cdot Z_{load} - Z_{g\_mcp1} \cdot Z_{p\_on}}{|A|} E,$$

where $|A|$, $E$ and $Z$ are represented by the following equations, respectively:

$$|A| = \begin{bmatrix} Z_{chp} + Z + Z_{g\_mcp1} & -Z_{g\_mcp1} & -Z_{chp} \\ -Z_{g\_mcp1} & Z_{g\_mcp1} + Z_{load} + Z_{n\_on} & -Z_{n\_on} \\ -Z_{chp} & -Z_{n\_on} & Z_{n\_on} + Z_{p\_on} + Z_{chp} \end{bmatrix} \qquad (21)$$

$$= Z_{g\_mcp1}(Z + Z_{load} + Z_{p\_on})(Z_{chp} + Z_{n\_on}) +$$

$$Z_{g\_mcp1} Z_{p\_on}(Z + Z_{load}) + Z_{load}(Z_{chp} + Z)(Z_{n\_on} + Z_{p\_on}) +$$

$$Z_{chp} Z(Z_{load} + Z_{n\_on}) + Z_{p\_on} Z_{n\_on}(Z_{chp} + Z)$$

$$E = Z_{n\_on} \times I_{S\_H2L\_vdq} \tag{22}$$

$$Z = Z_{v\_mcp1} + _{v\_mcp2} + Z_{g\_mcp2} \tag{23}$$

Figure 22:
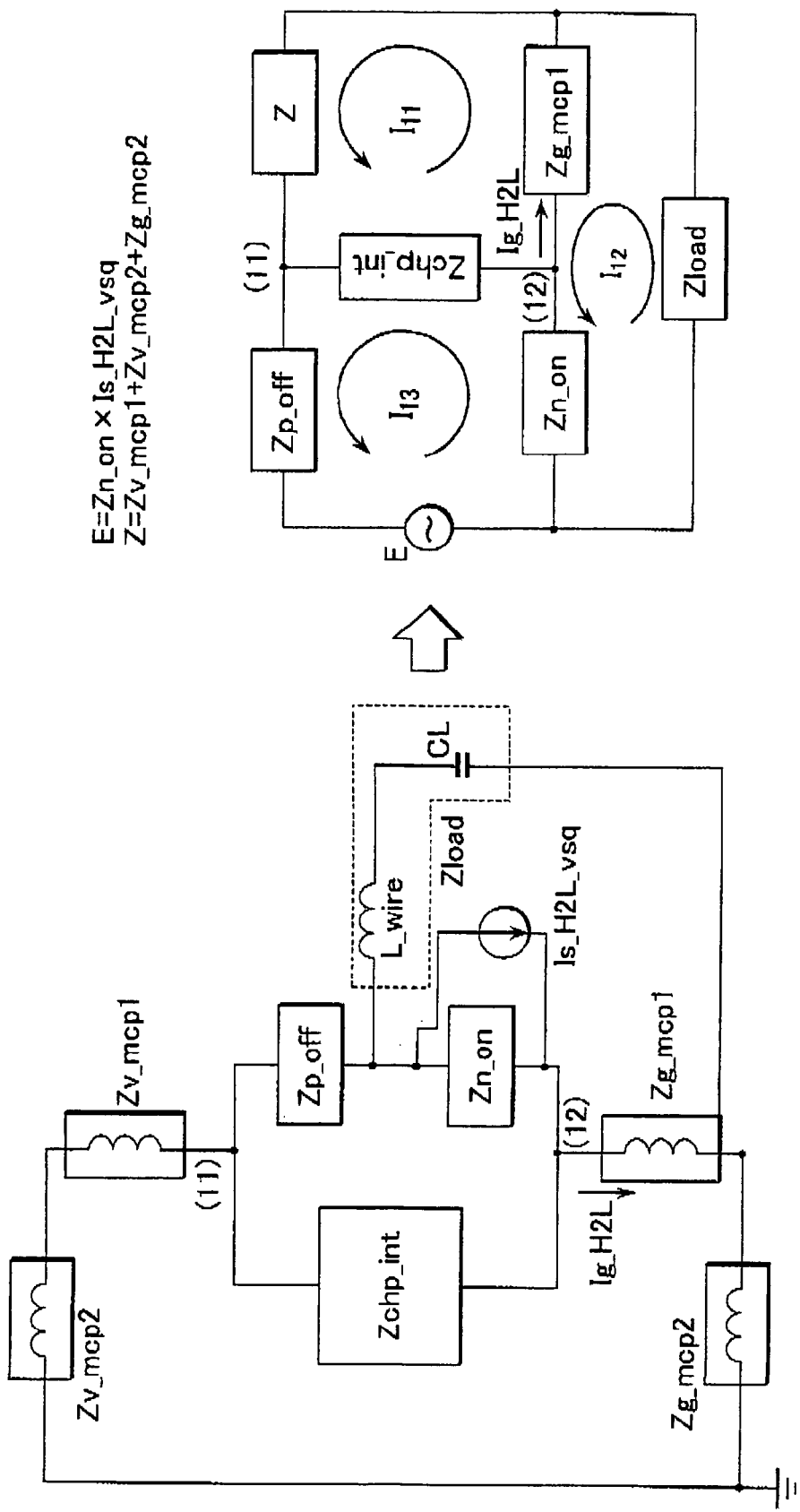
FIG. 22 is a view for use in describing how to calculate a ground voltage fluctuation spectrum in the second transition state.

Likewise, the created target impedance model as shown in FIG. 2 is connected with the second chip model for the analysis of the ground voltage fluctuation to obtain the combination as shown in FIG. 22, wherein the impedance Zvc_mcp of FIG. 2 is set to infinity, while each of the impedances Zgc_mcp, Zv_mcp3 and Zg_mcp3 is set to zero.

Next, loop equations are set up on the combination of the target impedance model and the first chip model. From the network of FIG. 20, the following three loop equations are set up:

$$\begin{bmatrix} Z_{chp} + Z + Z_{g\_mcp1} & -Z_{g\_mcp1} & -Z_{chp} \\ -Z_{g\_mcp1} & Z_{g2} + Z_{load} + Z_{n\_on} & -Z_{n\_on} \\ -Z_{chp} & -Z_{n\_on} & Z_{n\_on} + Z_{p\_off} + Z_{chp} \end{bmatrix} \tag{24}$$

$$\begin{bmatrix} I_{l1} \\ I_{l2} \\ I_{l3} \end{bmatrix} = \begin{bmatrix} 0 \\ \sim E \\ E \end{bmatrix}$$

The loop equations are solved, and the second target variable for the analysis of the ground voltage fluctuation is obtained without carrying out a transient analysis. The obtained second target variable in this embodiment is a ground voltage fluctuation spectrum $\Delta V_{SSQ\_H2L}$ and is represented as the following equation:

$$\Delta V_{DDQ\_H2L} = -(Z_{v\_mcp2} + Z_{v\_mcp1}) \times I_{l1} \tag{25}$$

$$= -(Z_{v\_mcp2} + Z_{v\_mcp1}) \times \frac{Z_{chp} \cdot Z_{load} - Z_{g\_mcp1} \cdot Z_{p\_off}}{|A|} E,$$

where |A|, E and Z are represented by the following equations, respectively:

$$|A| = \begin{bmatrix} Z_{chp} + Z + Z_{g\_mcp1} & -Z_{g\_mcp1} & -Z_{chp} \\ -Z_{g\_mcp1} & Z_{g\_mcp1} + Z_{load} + Z_{n\_on} & -Z_{n\_on} \\ -Z_{chp} & -Z_{n\_on} & Z_{n\_on} + Z_{p\_off} + Z_{chp} \end{bmatrix} \tag{26}$$

$$= Z_{g\_mcp1}(Z + Z_{load} + Z_{p\_off})(Z_{chp} + Z_{n\_on}) +$$
$$Z_{g\_mcp1}Z_{p\_off}(Z + Z_{load}) + Z_{load}(Z_{chp} + Z)(Z_{n\_on} + Z_{p\_off}) +$$
$$Z_{chp}Z(Z_{load} + Z_{n\_on}) + Z_{p\_off}Z_{n\_on}(Z_{chp} + Z)$$

$$E = Z_{n\_on} \times I_{S\_H2L\_vsq} \tag{27}$$

$$Z = Z_{v\_mcp1} + Z_{v\_mcp2} + Z_{g\_mcp2} \tag{28}$$

Although the impedance Zvc_mcp of FIG. 2 is set to infinity while each of the impedances Zgc_mcp, Zv_mcp3 and Zg_mcp3 is set to zero in the above-mentioned embodiment, the present invention is not limited thereto. In each case corresponding to FIG. 19, 20, 21 or 22, four loop equations may be set up without simplification of the impedances Zvc_mcp, Zgc_mcp, Zv_mcp3 and Zg_mcp3 and be solved.

Turning up to FIG. 11, one of the first target variable and the second target variable is selected as a main target variable (Step S104). In this embodiment, the first target variable and the second target variable are compared with each other, and inferior one of the first target variable and the second target variable is selected as the main target variable, in consideration of power integrity for the semiconductor chip 10.

In the present embodiment, a first constraint and a second constraint are prepared. Each of the first constraint and the second constraint is a voltage fluctuation spectrum represented in frequency domain. The first constraint and the second constraint are constraint of the first transition state and the second transition state, respectively. When the main target variable is decided, one of the constraint and the second constraint is selected as a predetermined constraint in correspondence with the transition state of the main target variable (Step S105).

Next, the main target variable and the predetermined constraint are compared with each other (Step S106). As a result of the comparison, design guidelines are decided for the adjustment target (Step S107).

The design guidelines are, for example, the optimized impedance of at least one of electrical paths included in the semiconductor package 100, the optimized width, length and/or thickness of at least one trace of a pattern or a wire included in at least one of the electrical paths, a result of pass/fail (validity/invalidity of design) determination for at least one trace of a pattern or at least one wire included in at least one of the electrical paths, the optimized electrical length of at least one of the electrical paths, the optimized number of layers constituting a substrate of the semiconductor package 100, the minimized width of at least one trace of a pattern included in at least one of the electrical paths if the target information relates to a length of the trace, and the maximized length of at least one trace of a pattern included in at least one of the electrical paths if the target information relates to a width of the trace. The design guidelines may include information about the identified problematic section as such, for example, the position thereof.

Figure 23:
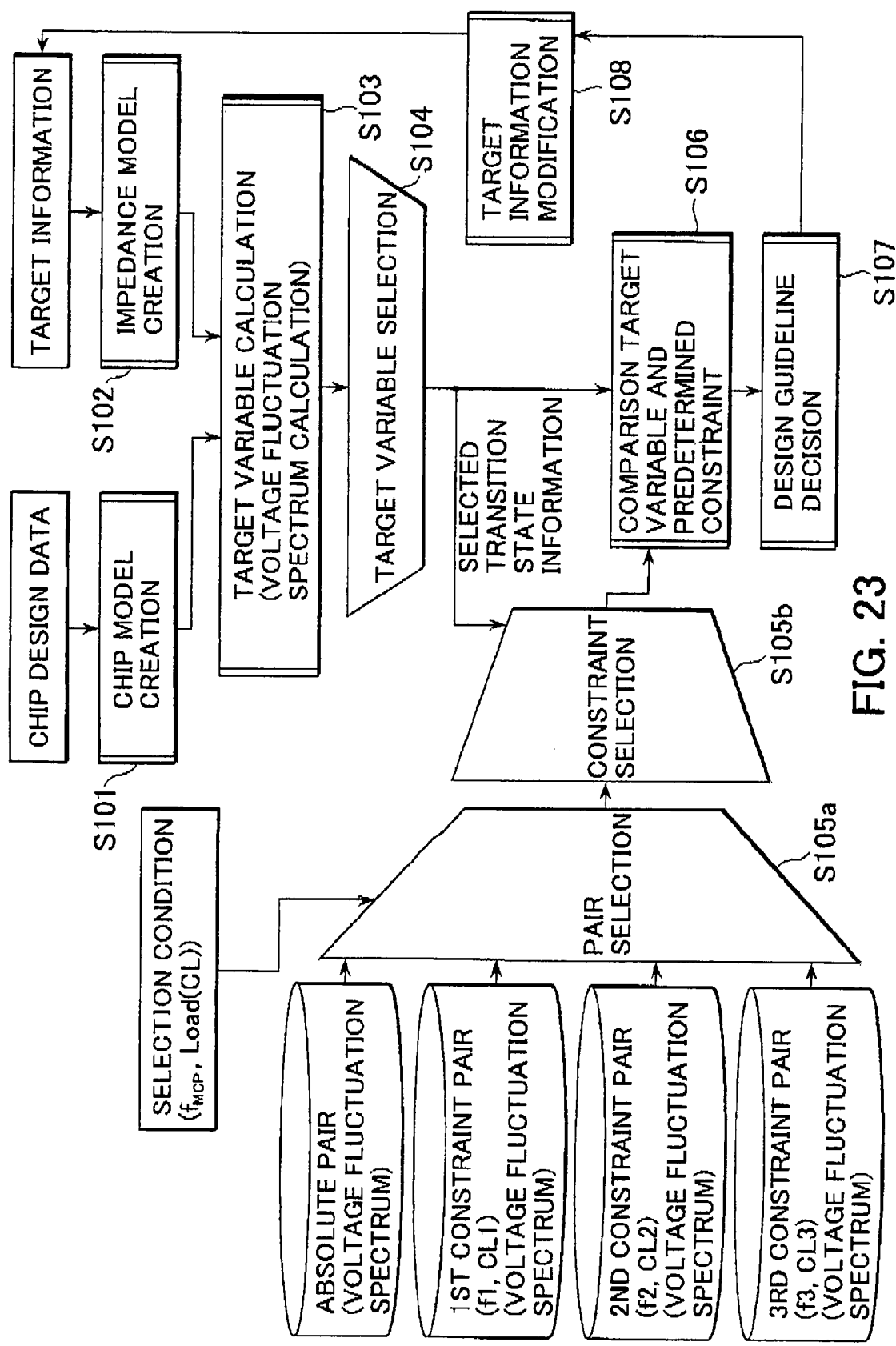
FIG. 23 is a flowchart showing a design method in accordance with a second embodiment of the present invention.

The method of FIG. 11 may be modified as another method of FIG. 23; there are generally included two modifications.

One of the modifications is that only a single pair of first and second constraints is prepared in the method of FIG. 11, but a plurality pairs of first and second constraints are prepared in the method of FIG. 23. In detail, the constraint pairs including "ABSOLUTE" are prepared in advance from an already-validated semiconductor package in consideration of various operational conditions. One of the constraint pairs is selected in accordance with the selection condition (Step S105a in FIG. 23). In this embodiment, the selection condition comprises operational conditions such as operation frequency $f_{MCP}$ of the semiconductor package 100 and its load CL. Note here that, among the constraint pairs, "ABSOLUTE" is a special constraint pair that does not relate to operational conditions and is selected when a selected condition clearly indicates the special constraint pair. After the pair selection, one of the first and the second constraints included in the selected pair is further selected in Step S105b of FIG. 23 in a manner similar to Step S105 of FIG. 11.

The other of the modifications is that the previously-used target information is modified in consideration of the decided design guidelines in Step S108 of FIG. 23; the modified target information is used in Step S102 of FIG. 23. The step is useful for the case where the method of the present invention is implemented as a design aid system, i.e. for an automated processing.

Figure 24:
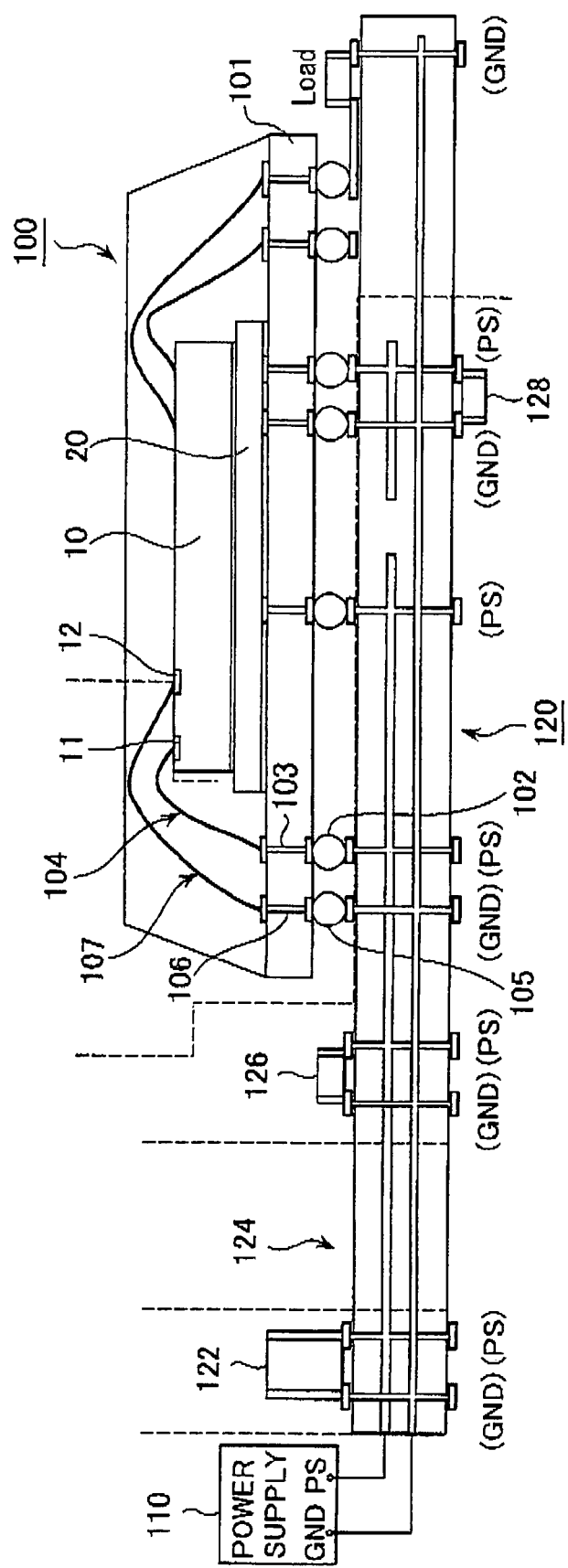
FIG. 24 is a view showing a semiconductor system to which an embodiment of the present invention is applicable.

Although the above explanation was directed to the MCP as an example of the semiconductor package, the present invention is also applicable to a single chip package. In addition, the present invention may be applied to a semiconductor system including a semiconductor package as shown in FIG. 24. In other words, the adjustment target may be enhanced to include electrical components formed on a printed circuit board on which a semiconductor package is mounted on.

The illustrated semiconductor system of FIG. 24 comprises a power supply unit 110, a printed circuit board (PCB) 120 and the multi-chip package (MCP) 100. The power supply unit 110 has a power supply portion (PS) and a ground portion (GND). The printed circuit board 120 comprises, as electrical components, a large capacitor 122, a power supply line 124, a bypass capacitor 126, and another bypass capacitor 128. The power supply line 124 is also referred to as a power supply pattern, a set of power supply traces, or a power supply plane. The bypass capacitor 126 is mounted on one surface of the printed circuit board 120, while the other bypass capacitor 128 is mounted the other surface of the printed circuit board 120. The multi-chip package 100 has a structure in which the semiconductor chip (DRAM chip) 10 and the semiconductor chip (logic chip) 20 are stacked on a package substrate 101. The power supply pad 11 of the semiconductor chip 10 is connected to a power supply terminal (ball) 102 through a through-hole 103, a power supply line (wire) 104, traces (not shown) and so on. The ground pad 12 of the semiconductor chip 10 is connected to a ground terminal (ball) 105 through a through-hole 106, a ground line (wire) 107, traces (not shown) and so on. The power supply terminal 102 is electrically connected to the power supply portion of the power supply unit 110. The ground terminal 105 is electrically connected to the ground portion of the power supply unit 110.

In this modification, the through-hole 103, the power supply line 104, traces and so on constitute an electrical path electrically connecting between the power supply pad 11 and the power supply terminal 102, while the through-hole 106, the ground line 107, traces and so on constitute another electrical path electrically connecting between the ground pad 12 and the ground terminal 105, respectively.

Figure 25:
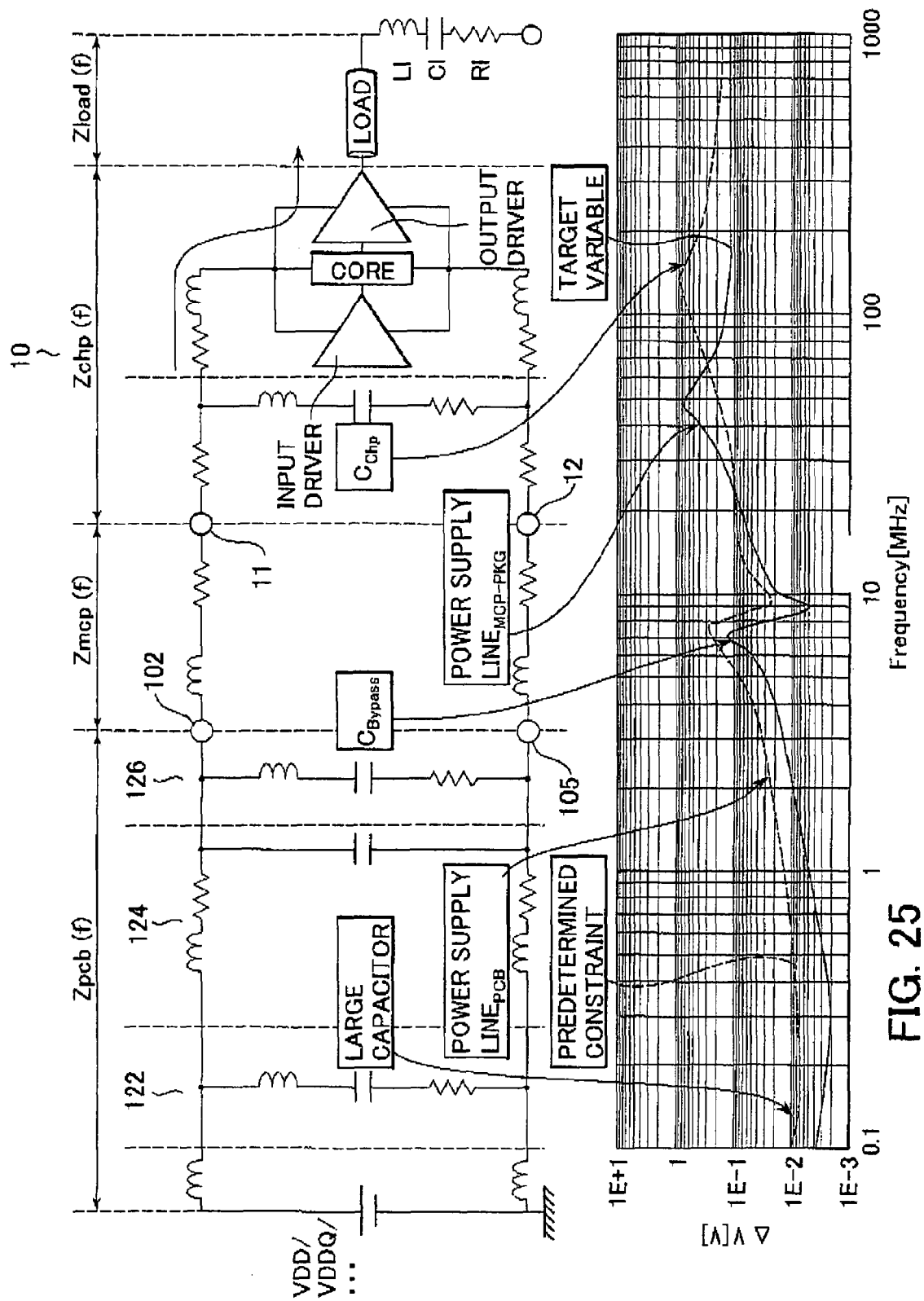
FIG. 25 is a view showing an analysis result of the semiconductor system of FIG. 24.

As shown in an upper part of FIG. 25, every electrical element constituting the adjustment target can be represented as an R/L/C element. Therefore, each section of the above-mentioned electrical paths can be represented as a passive circuit block so that the impedance of each section can be represented as a function of frequency, i.e. each section has a frequency-dependent impedance. Thus, ff the present invention is applied to the semiconductor system, a manner similar to the above-mentioned embodiment of the semiconductor package 100 can be used.

The methods according to the above-described embodiments may be embodied, at least in part, as hardware logic in a circuit.

Alternatively, the above-described methods may be embodied, at least in part, as a software computer program product for use with a computer system. Such an implementation may comprise a series of computer readable instructions either fixed on a tangible medium, such as a computer readable medium, e.g., diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, e.g., shrink wrapped software, pre-loaded with a computer system, e.g., on a system ROM or fixed disk, or distributed from a server or electronic bulletin board over a network, e.g., the Internet or World Wide Web.

Figure 26:
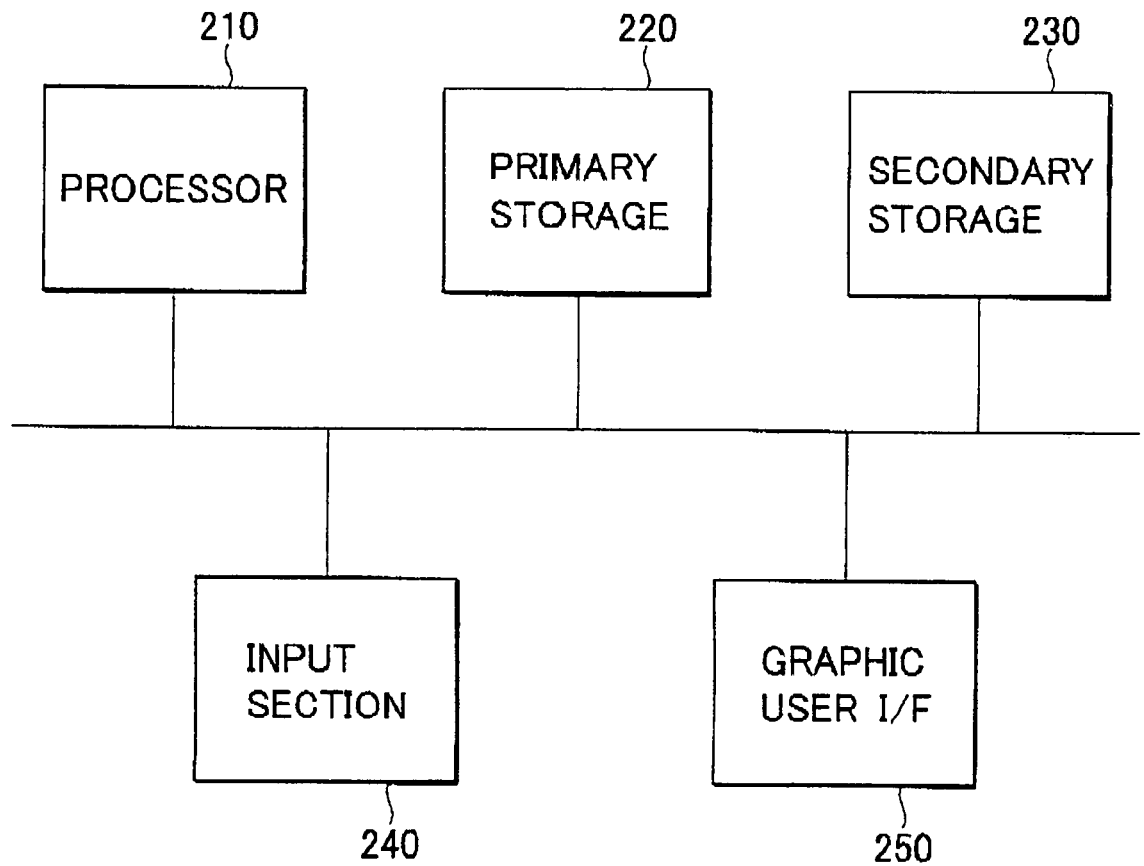
FIG. 26 is a block diagram showing a design aid system based on a method of an embodiment of the present invention.

With reference to FIG. 26, a system comprises a processor 210, a primary storage 220, a secondary storage 230, an input section 240 and a graphic user interface 250. The system may comprise various kinds of other computer components. The graphic user interface 250 is for example a display unit such as a cathode ray tube (CRT) display device, or a liquid crystal display (LCD) device. The secondary storage 230 is a hard disk drive in this embodiment and stores a computer program of the present embodiment. The primary storage 220 is a DRAM memory device in this embodiment. The computer program is loaded on the primary storage 220 and is executed by the processor 210 to cause the system to perform as a design aid system in accordance with one of the above-described methods. The primary storage serves as a temporal storage where the processor 210 stores temporal data during executing of the computer program. Taking a general-purpose computer system into consideration, the primary storage 220 and the secondary storage 230 are separated. However, the present invention is not limited thereto. The system may comprise a single storage instead of the primary storage 220 and the secondary storage 230.

In the design aid system as the implementation of the above-described method, the design guidelines may be shown by the graphic user interface 250.

The present application is based on Japanese patent applications of JP2006-052360 filed before the Japan Patent Office on Feb. 28, 2006, the contents of which are incorporated herein by reference.

While there has been described what is believed to be the preferred embodiment of the invention, those skilled in the art will recognize that other and further modifications may be made thereto without departing from the sprit of the invention, and it is intended to claim all such embodiments that fall within the true scope of the invention.

What is claimed is:

1. A method for designing a semiconductor package, the semiconductor package comprising a semiconductor chip and an adjustment target, the method comprising carrying out the following steps in a computer:

calculating a first target variable on the basis of a first chip model and a target impedance model, the first chip model being created by representing the semiconductor chip in frequency domain in consideration of a first transition state, the first transition state being a state where an output level of the semiconductor chip changes from a low level to a high level, the target impedance model being assumed by representing the adjustment target in frequency domain;

calculating a second target variable on the basis of a second chip model and the target impedance model, the second chip model being created by representing the semiconductor chip in frequency domain in consideration of a second transition state, the second transition state being a state where an output level of the semiconductor chip changes from the high level to the low level:
in consideration of power integrity for the semiconductor chip, selecting inferior one of the first and the second target variables as a main target variable; and
comparing the main target variable and a predetermined constraint represented in frequency domain to decide design guidelines for the adjustment target.

2. The method according to claim 1, further comprising selecting one of first and second constraints as the predetermined constraint, the first constraint being assumed in consideration of the first transition state, the second constraint being assumed in consideration of the second transition state, the predetermined constraint being the first constraint when the first target variable is selected as the main target variable, the predetermined constraint being the second constraint when the second target variable is selected as the main target variable.

3. The method according to claim 1, wherein;
the calculating the first target variable is carried out so that the first target variable is a power-supply/ground voltage spectrum in the first transition state; and
the calculating the second target variable is carried out so that the second target variable is another power-supply/ground voltage spectrum in the second transition state.

4. The method according to claim 1, further comprising: creating the first and the second chip models on the basis of chip information about the semiconductor chip; and assuming the target impedance model on the basis of target information about the adjustment target.

5. The method according to claim 4, wherein:
the calculating the first target variable is carried out under a state where the first chip model is connected to the target impedance model; and
the calculating the second target variable is carried out under a state where the second chip model is connected to the target impedance model.

6. The method according to claim 4 the semiconductor chip comprising a power supply pad, a ground pad, an output pad, a pMOS circuitry, an nMOS circuitry and an internal section, the pMOS circuitry being connected between the power supply pad and the output pad, the nMOS circuitry being connected between the output pad and the ground pad, the internal section being connected between the power supply pad and the ground pad, the internal section having an internal impedance, wherein the creating the first and the second chip models comprises:
creating the first chip model by connecting a first pMOS circuitry impedance and a first current source in parallel between the power supply pad and the output pad, by connecting a first nMOS circuitry impedance between the output pad and the ground pad, and by connecting the internal impedance between the power supply pad and the ground pad, the first pMOS circuitry impedance being obtained by representing the pMOS circuitry in impedance in consideration of the first transition state, the first nMOS circuitry impedance being obtained by representing the nMOS circuitry in impedance in consideration of the first transition state, the first current source being assumed on the basis of current fluctuation on the power supply pad in the first transition state; and
creating the second chip model by connecting a second pMOS circuitry impedance between the power supply pad and the output pad, by connecting a second nMOS circuitry impedance and a second current source in parallel between the output pad and the ground pad, and by connecting the internal impedance between the power supply pad and the ground pad, the second pMOS circuitry impedance being obtained by representing the pMOS circuitry in impedance in consideration of the second transition state, the second nMOS circuitry impedance being obtained by representing the nMOS circuitry in impedance in consideration of the second transition state, the second current source being assumed on the basis of current fluctuation on the ground pad in the second transition state.

7. The method according to claim 6, wherein:
in order to create the first chip model for use in analysis of voltage fluctuation on the power supply pad, the first pMOS circuitry impedance is assumed as an impedance of the pMOS circuitry being on an ON state, and the first nMOS circuitry impedance is assumed as an impedance of the nMOS circuitry being on an OFF state; and
in order to create the second chip model for use in analysis of voltage fluctuation on the power supply pad, the second pMOS circuitry impedance is assumed as an impedance of the pMOS circuitry being on an ON state, and the second nMOS circuitry impedance is assumed as an impedance of the nMOS circuitry being on an ON state.

8. The method according to claim 7, wherein:
the impedance of the pMOS circuitry of the ON state is calculated by using an equivalent circuit model comprising a capacitor and a resistor connected in parallel between the power supply pad and the output pad;
the impedance of the nMOS circuitry of the OFF state is calculated by using an equivalent circuit model comprising a capacitor and a resistor connected in series between the output pad and the ground pad; and
the impedance of the nMOS circuitry of the ON state is calculated by using an equivalent circuit model comprising a capacitor and a resistor connected in parallel between the output pad and the ground pad.

9. The method according to claim 7, wherein:
the first current source is calculated on the basis of assumptions that a predetermined load model is connected between the output pad and the ground pad, that a first power supply current flows through the power supply pad in the first transition state, and that the first power supply current generally flows into the first pMOS circuitry impedance and the predetermined load model; and
the second current source is calculated on the basis of assumptions that the predetermined load model is connected between the output pad and the ground pad, that a second power supply current flows through the power supply pad in the second transition state, and that the second power supply current generally flows into the second pMOS circuitry impedance and the second nMOS circuitry impedance.

10. The method according to claim 6, wherein:
in order to create the first chip model for use in analysis of voltage fluctuation on the ground pad, the first pMOS circuitry impedance is assumed as an impedance of the pMOS circuitry being on an ON state, and the first nMOS circuitry impedance is assumed as an impedance of the nMOS circuitry being on an ON state; and
in order to create the second chip model for use in analysis of voltage fluctuation on the ground pad, the second pMOS circuitry impedance is assumed as an impedance of the pMOS circuitry being on an OFF state, and the second nMOS circuitry impedance is assumed as an impedance of the nMOS circuitry being on an ON state.

11. The method according to claim 10, wherein:

the impedance of the pMOS circuitry of the ON state is calculated by using an equivalent circuit model comprising a capacitor and a resistor connected in parallel between the power supply pad and the output pad;

the impedance of the pMOS circuitry of the OFF state is calculated by using an equivalent circuit model comprising a capacitor and a resistor connected in series between the power supply pad and the output pad; and the impedance of the nMOS circuitry of the ON state is calculated by using an equivalent circuit model comprising a capacitor and a resistor connected in parallel between the output pad and the ground pad.

12. The method according to claim 10, wherein:

the first current source is calculated on the basis of assumptions that a predetermined load model is connected between the output pad and the ground pad, that a first ground current flows through the ground pad in the first transition state, and that the first ground current generally flows into the first pMOS circuitry impedance and the first nMOS circuitry impedance; and the second current source is calculated on the basis of assumptions that the predetermined load model is connected between the output pad and the ground pad, that a second ground current flows through the ground pad in the second transition state, and that the second ground current generally flows into the predetermined load model and the second nMOS circuitry impedance.

13. The method according to claim 1, wherein:

the calculating the first target variable comprises combining the target impedance model with the first chip model, setting up a first loop equation on the combination of the target impedance model and the first chip model, and solving the first loop equation to obtain the first target variable; and the calculating the second target variable comprises combining the target impedance model with the second chip model, setting up a second loop equation on the combination of the target impedance model and the second chip model, and solving the second loop equation to obtain the second target variable.

14. The method according to claim 1, wherein the adjustment target is enhanced to includes electrical components formed on a printed circuit board, the semiconductor package being mounted on the printed circuit board.

15. The method according to claim 1, wherein the comparing comprising:

identifying a problematic section of the adjustment target, the problematic section corresponding to a frequency region at which the main target variable exceeds the predetermined constraint; and deciding design guidelines to solve the identified problematic section.

16. A system for aiding to design a semiconductor package, the semiconductor package comprising a semiconductor chip and an adjustment target, the system comprising:

a first calculator configured to calculate a first target variable on the basis of a first chip model and a target impedance model, the first chip model being created by representing the semiconductor chip in frequency domain in consideration of a first transition state, the first transition state being a state where an output level of the semiconductor chip changes from a low level to a high level, the target impedance model being assumed by representing the adjustment target in frequency domain;

a second calculator configured to calculate a second target variable on the basis of a second chip model and the target impedance model, the second chip model being created by representing the semiconductor chip in frequency domain in consideration of a second transition state, the second transition state being a state where an output level of the semiconductor chip changes from the high level to the low level;

a selector configured to select, in consideration of power integrity for the semiconductor chip, inferior one of the first and the second target variables as a main target variable in consideration of power integrity for the semiconductor chip; and a comparator configured to compare the main target variable and a predetermined constraint represented in frequency domain to decide design guidelines for the adjustment target.

17. A system comprising a bus system, a processor connected to the bus system and a memory connected to the bus system, the memory storing a computer program that, when executed by the processor, causes the processor to perform predetermined operations to aid to design a semiconductor package, the semiconductor package comprising a semiconductor chip and an adjustment target, the predetermined operations comprising:

calculating a first target variable on the basis of a first chip model and a target impedance model, the first chip model being created by representing the semiconductor chip in frequency domain in consideration of a first transition state, the first transition state being a state where an output level of the semiconductor chip changes from a low level to a high level, the target impedance model being assumed by representing the adjustment target in frequency domain;

calculating a second target variable on the basis of a second chip model and the target impedance model, the second chip model being created by representing the semiconductor chip in frequency domain in consideration of a second transition state, the second transition state being a state where an output level of the semiconductor chip changes from the high level to the low level;

in consideration of power integrity for the semiconductor chip, selecting inferior one of the first and the second target variables as a main target variable; and comparing the main target variable and a predetermined constraint represented in frequency domain to decide design guidelines for the adjustment target.

18. The system according to claim 17, wherein the predetermined operations further comprise selecting one of first and second constraints as the predetermined constraint, the first constraint being assumed in consideration of the first transition state, the second constraint being assumed in consideration of the second transition state, the predetermined constraint being the first constraint when the first target variable is selected as the main target variable, the predetermined constraint being the second constraint when the second target variable is selected as the main target variable.

19. The system according to claim 17, wherein:

the calculating the first target variable is carried out so that the first target variable is a power-supply/ground voltage spectrum in the first transition state; and the calculating the second target variable is carried out so that the second target variable is another power-supply/ground voltage spectrum in the second transition state.

20. The system according to claim 17, wherein the predetermined operations further comprise: creating the first and the second chip models on the basis of chip information about the semiconductor chip; and assuming the target impedance model on the basis of target information about the adjustment target.

21. The system according to claim 20, wherein:
the calculating the first target variable is carried out under a state where the first chip model is connected to the target impedance model; and
the calculating the second target variable is carried out under a state where the second chip model is connected to the target impedance model.

22. The system according to claim 20, the semiconductor chip comprising a power supply pad, a ground pad, an output pad, a pMOS circuitry, an nMOS circuitry and an internal section, the pMOS circuitry being connected between the power supply pad and the output pad, the nMOS circuitry being connected between the output pad and the ground pad, the internal section being connected between the power supply pad and the ground pad, the internal section having an internal impedance, wherein the creating the first and the second chip models comprises:
creating the first chip model by connecting a first pMOS circuitry impedance and a first current source in parallel between the power supply pad and the output pad, by connecting a first nMOS circuitry impedance between the output pad and the ground pad, and by connecting the internal impedance between the power supply pad and the ground pad, the first pMOS circuitry impedance being obtained by representing the pMOS circuitry in impedance in consideration of the first transition state, the first nMOS circuitry impedance being obtained by representing the nMOS circuitry in impedance in consideration of the first transition state, the first current source being assumed on the basis of current fluctuation on the power supply pad in the first transition state; and
creating the second chip model by connecting a second pMOS circuitry impedance between the power supply pad and the output pad, by connecting a second nMOS circuitry impedance and a second current source in parallel between the output pad and the ground pad, and by connecting the internal impedance between the power supply pad and the ground pad, the second pMOS circuitry impedance being obtained by representing the pMOS circuitry in impedance in consideration of the second transition state, the second nMOS circuitry impedance being obtained by representing the nMOS circuitry in impedance in consideration of the second transition state, the second current source being assumed on the basis of current fluctuation on the ground pad in the second transition state.

23. The system according to claim 22, wherein:
in order to create the first chip model for use in analysis of voltage fluctuation on the power supply pad, the first pMOS circuitry impedance is assumed as an impedance of the pMOS circuitry being on an ON state, and the first nMOS circuitry impedance is assumed as an impedance of the nMOS circuitry being on an OFF state; and
in order to create the second chip model for use in analysis of voltage fluctuation on the power supply pad, the second pMOS circuitry impedance is assumed as an impedance of the pMOS circuitry being on an ON state, and the second nMOS circuitry impedance is assumed as an impedance of the nMOS circuitry being on an ON state.

24. The system according to claim 23, wherein:
the impedance of the pMOS circuitry of the ON state is calculated by using an equivalent circuit model comprising a capacitor and a resistor connected in parallel between the power supply pad and the output pad;
the impedance of the nMOS circuitry of the OFF state is calculated by using an equivalent circuit model comprising a capacitor and a resistor connected in series between the output pad and the ground pad; and
the impedance of the nMOS circuitry of the ON state is calculated by using an equivalent circuit model comprising a capacitor and a resistor connected in parallel between the output pad and the ground pad.

25. The system according to claim 23, wherein:
the first current source is calculated on the basis of assumptions that a predetermined load model is connected between the output pad and the ground pad, that a first power supply current flows through the power supply pad in the first transition state, and that the first power supply current generally flows into the first pMOS circuitry impedance and the predetermined load model; and
the second current source is calculated on the basis of assumptions that the predetermined load model is connected between the output pad and the ground pad, that a second power supply current flows through the power supply pad in the second transition state, and that the second power supply current generally flows into the second pMOS circuitry impedance and the second nMOS circuitry impedance.

26. The system according to claim 22, wherein:
in order to create the first chip model for use in analysis of voltage fluctuation on the ground pad, the first pMOS circuitry impedance is assumed as an impedance of the pMOS circuitry being on an ON state, and the first nMOS circuitry impedance is assumed as an impedance of the nMOS circuitry being on an ON state; and
in order to create the second chip model for use in analysis of voltage fluctuation on the ground pad, the second pMOS circuitry impedance is assumed as an impedance of the pMOS circuitry being on an OFF state, and the second nMOS circuitry impedance is assumed as an impedance of the nMOS circuitry being on an ON state.

27. The system according to claim 26, wherein:
the impedance of the pMOS circuitry of the ON state is calculated by using an equivalent circuit model comprising a capacitor and a resistor connected in parallel between the power supply pad and the output pad;
the impedance of the pMOS circuitry of the OFF state is calculated by using an equivalent circuit model comprising a capacitor and a resistor connected in series between the power supply pad and the output pad; and
the impedance of the nMOS circuitry of the ON state is calculated by using an equivalent circuit model comprising a capacitor and a resistor connected in parallel between the output pad and the ground pad.

28. The system according to claim 26, wherein:
the first current source is calculated on the basis of assumptions that a predetermined load model is connected between the output pad and the ground pad, that a first ground current flows through the ground pad in the first transition state, and that the first ground current generally flows into the first pMOS circuitry impedance and the first nMOS circuitry impedance; and
the second current source is calculated on the basis of assumptions that the predetermined load model is connected between the output pad and the ground pad, that a second ground current flows through the ground pad in the second transition state, and that the second ground current generally flows into the predetermined load model and the second nMOS circuitry impedance.

29. The system according to claim 17, wherein:
the calculating the first target variable comprises combining the target impedance model with the first chip model, setting up a first loop equation on the combination of the target impedance model and the first chip model, and solving the first loop equation to obtain the first target variable; and
the calculating the second target variable comprises combining the target impedance model with the second chip model, setting up a second loop equation on the combination of the target impedance model and the second chip model, and solving the second loop equation to obtain the second target variable.

30. The system according to claim 17, wherein the adjustment target is enhanced to includes electrical components formed on a printed circuit board, the semiconductor package being mounted on the printed circuit board.

31. The system according to claim 17, wherein the comparing comprising:
identifying a problematic section of the adjustment target, the problematic section corresponding to a frequency region at which the main target variable exceeds the predetermined constraint; and
deciding design guidelines to solve the identified problematic section.

32. A computer program product in a computer readable medium for use in a system for aiding to design a semiconductor package, the semiconductor package comprising a semiconductor chip and an adjustment target, the computer program product comprising:
instructions for calculating a first target variable on the basis of a first chip model and a target impedance model, the first chip model being created by representing the semiconductor chip in frequency domain in consideration of a first transition state, the first transition state being a state where an output level of the semiconductor chip changes from a low level to a high level, the target impedance model being assumed by representing the adjustment target in frequency domain;
instructions for calculating a second target variable on the basis of a second chip model and the target impedance model, the second chip model being created by representing the semiconductor chip in frequency domain in consideration of a second transition state, the second transition state being a state where an output level of the semiconductor chip changes from the high level to the low level;
instructions for selecting, in consideration of power integrity for the semiconductor chip, inferior one of the first and the second target variables as a main target variable; and
instructions for comparing the main target variable and a predetermined constraint represented in frequency domain to decide design guidelines for the adjustment target.

33. The computer program product according to claim 32, further comprising instructions for selecting one of first and second constraints as the predetermined constraint, the first constraint being assumed in consideration of the first transition state, the second constraint being assumed in consideration of the second transition state, the predetermined constraint being the first constraint when the first target variable is selected as the main target variable, the predetermined constraint being the second constraint when the second target variable is selected as the main target variable.

34. The computer program product according to claim 32, wherein,
the instructions for calculating the first target variable is carried out so that the first target variable is a power-supply/ground voltage spectrum in the first transition state; and
the instructions for calculating the second target variable is carried out so that the second target variable is another power-supply/ground voltage spectrum in the second transition state.

35. The computer program product according to claim 32, further comprising: instructions for creating the first and the second chip models on the basis of chip information about the semiconductor chip; and instructions for assuming the target impedance model on the basis of target information about the adjustment target.

36. The computer program product according to claim 35, wherein:
the instructions for calculating the first target variable is carried out under a state where the first chip model is connected to the target impedance model; and
the instructions for calculating the second target variable is carried out under a state where the second chip model is connected to the target impedance model.

37. The computer program product according to claim 35, the semiconductor chip comprising a power supply pad, a ground pad, an output pad, a pMOS circuitry, an nMOS circuitry and an internal section, the pMOS circuitry being connected between the power supply pad and the output pad, the nMOS circuitry being connected between the output pad and the ground pad, the internal section being connected between the power supply pad and the ground pad, the internal section having an internal impedance, wherein the instructions for creating the first and the second chip models comprises:
instructions for creating the first chip model by connecting a first pMOS circuitry impedance and a first current source in parallel between the power supply pad and the output pad, by connecting a first nMOS circuitry impedance between the output pad and the ground pad, and by connecting the internal impedance between the power supply pad and the ground pad, the first pMOS circuitry impedance being obtained by representing the pMOS circuitry in impedance in consideration of the first transition state, the first nMOS circuitry impedance being obtained by representing the nMOS circuitry in impedance in consideration of the first transition state, the first current source being assumed on the basis of current fluctuation on the power supply pad in the first transition state; and
instructions for creating the second chip model by connecting a second pMOS circuitry impedance between the power supply pad and the output pad, by connecting a second nMOS circuitry impedance and a second current source in parallel between the output pad and the ground pad, and by connecting the internal impedance between the power supply pad and the ground pad, the second pMOS circuitry impedance being obtained by representing the pMOS circuitry in impedance in consideration of the second transition state, the second nMOS circuitry impedance being obtained by representing the nMOS circuitry in impedance in consideration of the second transition state, the second current source being assumed on the basis of current fluctuation on the ground pad in the second transition state.

38. The computer program product according to claim 37, wherein:
in order to create the first chip model for use in analysis of voltage fluctuation on the power supply pad, the first pMOS circuitry impedance is assumed as an impedance of the pMOS circuitry being on an ON state, and the first nMOS circuitry impedance is assumed as an impedance of the nMOS circuitry being on an OFF state; and in order to create the second chip model for use in analysis of voltage fluctuation on the power supply pad, the second pMOS circuitry impedance is assumed as an impedance of the pMOS circuitry being on an ON state, and the second nMOS circuitry impedance is assumed as an impedance of the nMOS circuitry being on an ON state.

39. The computer program product according to claim 38, wherein;

the impedance of the pMOS circuitry of the ON state is calculated by using an equivalent circuit model comprising a capacitor and a resistor connected in parallel between the power supply pad and the output pad;

the impedance of the nMOS circuitry of the OFF state is calculated by using an equivalent circuit model comprising a capacitor and a resistor connected in series between the output pad and the ground pad; and the impedance of the nMOS circuitry of the ON state is calculated by using an equivalent circuit model comprising a capacitor and a resistor connected in parallel between the output pad and the ground pad.

40. The computer program product according to claim 38, wherein:

the first current source is calculated on the basis of assumptions that a predetermined load model is connected between the output pad and the ground pad, that a first power supply current flows through the power supply pad in the first transition state, and that the first power supply current generally flows into the first pMOS circuitry impedance and the predetermined load model; and the second current source is calculated on the basis of assumptions that the predetermined load model is connected between the output pad and the ground pad, that a second power supply current flows through the power supply pad in the second transition state, and that the second power supply current generally flows into the second pMOS circuitry impedance and the second nMOS circuitry impedance.

41. The computer program product according to claim 37, wherein:

in order to create the first chip model for use in analysis of voltage fluctuation on the power supply pad, the instructions for creating the first chip model comprises instructions for carrying out an transient analysis on a SPICE model for the semiconductor chip in accordance with the first transition state to obtain a first current waveform and instructions for carrying out the Fourier transform for the first current waveform to obtain a spectrum of a current flowing through the power supply pad in the first transition state; and in order to create the second chip model for use in analysis of voltage fluctuation on the power supply pad, instructions for creating the second chip model comprises instructions for carrying out an transient analysis on a SPICE model for the semiconductor chip in accordance with the second transition state to obtain a second current waveform and instructions for carrying out the Fourier transform for the second current waveform to obtain a spectrum of a current flowing through the power supply pad in the second transition state.

42. The computer program product according to claim 36, wherein:

in order to create the first chip model for use in analysis of voltage fluctuation on the ground pad, the first pMOS circuitry impedance is assumed as an impedance of the pMOS circuitry being on an ON state, and the first nMOS circuitry impedance is assumed as an impedance of the nMOS circuitry being on an ON state; and in order to create the second chip model for use in analysis of voltage fluctuation on the ground pad, the second pMOS circuitry impedance is assumed as an impedance of the pMOS circuitry being on an OFF state, and the second nMOS circuitry impedance is assumed as an impedance of the nMOS circuitry being on an ON state.

43. The computer program product according to claim 42, wherein:

the impedance of the pMOS circuitry of the ON state is calculated by using an equivalent circuit model comprising a capacitor and a resistor connected in parallel between the power supply pad and the output pad;

the impedance of the pMOS circuitry of the OFF state is calculated by using an equivalent circuit model comprising a capacitor and a resistor connected in series between the power supply pad and the output pad; and the impedance of the nMOS circuitry of the ON state is calculated by using an equivalent circuit model comprising a capacitor and a resistor connected in parallel between the output pad and the ground pad.

44. The computer program product according to claim 42, wherein:

the first current source is calculated on the basis of assumptions that a predetermined load model is connected between the output pad and the ground pad, that a first ground current flows through the ground pad in the first transition state, and that the first ground current generally flows into the first pMOS circuitry impedance and the first nMOS circuitry impedance; and the second current source is calculated on the basis of assumptions that the predetermined load model is connected between the output pad and the ground pad, that a second ground current flows through the ground pad in the second transition state, and that the second ground current generally flows into the predetermined load model and the second nMOS circuitry impedance.

45. The computer program product according to claim 37, wherein:

in order to create the first chip model for use in analysis of voltage fluctuation on the ground pad, the instructions for creating the first chip model comprises instructions for carrying out an transient analysis on a SPICE model for the semiconductor chip in accordance with the first transition state to obtain a first current waveform and instructions for carrying out the Fourier transform for the first current waveform to obtain a spectrum of a current flowing through the ground pad in the first transition state; and in order to create the second chip model for use in analysis of voltage fluctuation on the ground pad, instructions for creating the second chip model comprises instructions for carrying out an transient analysis on a SPICE model for the semiconductor chip in accordance with the second transition state to obtain a second current waveform and instructions for carrying out the Fourier transform for the second current waveform to obtain a spectrum of a current flowing through the ground pad in the second transition state.

46. The computer program product according to claim 32, wherein, the instructions for calculating the first target variable comprises combining the target impedance model with the first chip model, setting up a first loop equation on the combination of the target impedance model and the first chip model, and solving the first loop equation to obtain the first target variable; and the instructions for calculating the second target variable comprises combining the target impedance model with the second chip model, setting up a second loop equation on the combination of the target impedance model and the second chip model, and solving the second loop equation to obtain the second target variable.

47. The computer program product according to claim 32, wherein the adjustment target is enhanced to include electrical components formed on a printed circuit board, the semiconductor package being mounted on the printed circuit board.

48. The computer program product according to claim 32, wherein the instructions for comparing comprising;

instructions for identifying a problematic section of the adjustment target, the problematic section corresponding to a frequency region at which the main target variable exceeds the predetermined constraint; and instructions for deciding design guidelines to solve the identified problematic section.

\* \* \* \* \*